United States Patent [19]
Kawano et al.

[11] Patent Number: 5,432,734
[45] Date of Patent: Jul. 11, 1995

[54] MAGNETORESISTIVE ELEMENT AND DEVICES UTILIZING THE SAME

[75] Inventors: Yuji Kawano; Tatsuya Fukami; Motohisa Taguchi; Kazuhiko Tsutsumi, all of Amagasaki, Japan

[73] Assignee: Mitsubishi Denki Kabushiki Kaisha, Tokyo, Japan

[21] Appl. No.: 170,773

[22] Filed: Dec. 21, 1993

[30] Foreign Application Priority Data

Aug. 30, 1993 [JP] Japan .................. 5-214123

[51] Int. Cl.⁶ ............. G11C 11/14; G11B 5/127
[52] U.S. Cl. ............. 365/158; 365/173; 324/252; 360/113
[58] Field of Search ........ 365/158, 173; 360/113; 324/252; 338/32 R

[56] References Cited

U.S. PATENT DOCUMENTS

| | | | |
|---|---|---|---|
| 5,134,533 | 7/1992 | Friedrich et al. | 360/113 |
| 5,159,513 | 10/1992 | Dieny et al. | 360/113 |
| 5,206,590 | 4/1993 | Dieny et al. | 324/252 |
| 5,287,238 | 2/1994 | Baumgart et al. | 360/113 |

FOREIGN PATENT DOCUMENTS 4-358310 12/1992 Japan .

OTHER PUBLICATIONS

B. Dieny et al., "Magnetotransport Properties of Magnetically Soft Spin-Valve Structures (invited)", *J. Appl. Phys.*, vol. 69, No. 8, Apr. 15, 1991, pp. 4774–4779.

T. Shinjo et al., "Large Magnetoresistance of Field-Inducted Giant Ferrimagnetic Multilayers", *J. of The Physical Society of Japan*, vol. 59, No. 9, Sep. 1990, pp. 3061–3064.

M. N. Baibich et al., "Giant Magnetoresistance of (001)Fe/(110) Cr Magnetic Superlattices" *Physical Review Letters*, vol. 61, No. 21, Nov. 21, 1988, pp. 2472–2475.

*Primary Examiner*—Joseph A. Popek
*Attorney, Agent, or Firm*—Burns, Doane, Swecker & Mathis

[57] ABSTRACT

A MR element which has a basically three-layered structure wherein the first and the second magnetic layer sandwich the nonmagnetic layer or of a basically five-layered structure wherein nonmagnetic layers are sandwiched between the first and second magnetic layers and between the second and third magnetic layers, respectively. The MR element of such arrangement offers a surprisingly large MR ratio under application of a sufficiently low magnetic field despite such a simple arrangement thereof.

34 Claims, 20 Drawing Sheets

F I G. 13
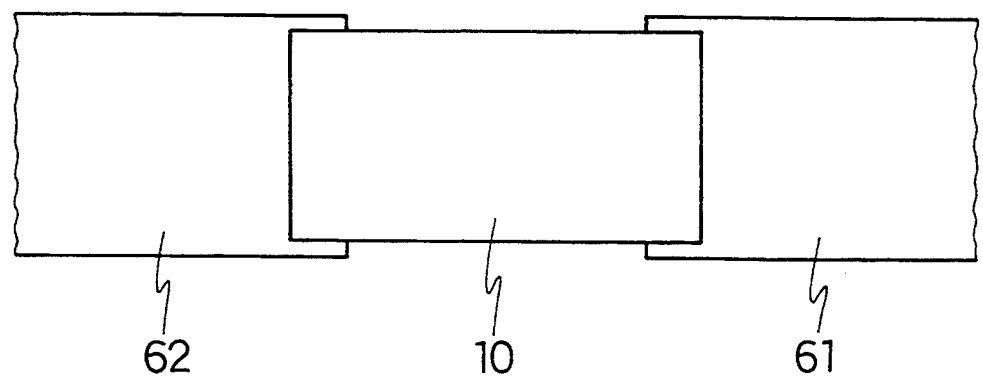

MAGNETORESISTIVE ELEMENT AND DEVICES UTILIZING THE SAME

BACKGROUND OF THE INVENTION

The present invention relates to a magnetoresistive element exhibiting magnetoresistance effect and to devices utilizing the magnetoresistive element such as a magnetic thin film memory and a magnetoresistance sensor. More particularly, it relates to a magnetoresistive element of a basically three-layered or five-layered structure which magnetic layers sandwich a nonmagnetic layer.

A phenomenon that a substance varies the electrical resistivity under the application of an external magnetic field is called "magnetoresistance effect" (hereinafter referred to as "MR effect"), and semiconductors and magnetic materials have been known to exhibit this effect.

Among these materials, common ferromagnetic materials exhibit the so-called "anisotropic magnetoresistance effect" (hereinafter referred to as "AMR effect") wherein when $\theta$ is the angle formed between a magnetization direction and a current direction, the electrical resistivity changes according to a factor of $\cos^2 \theta$. Ni—Fe alloys are known as materials exhibiting a large AMR effect, which offer the "megnetoresistance ratio" (hereinafter referred to as "MR ratio") of about 3%. Conventional magnetoresistive elements (MR elements) utilize the AMR effect and offer a small MR ratio though they are operative in response to a relatively low magnetic field. Accordingly, there has been a great desire to develop a MR element offering a large MR ratio.

Recently a multilayered film in which magnetic layers 71 's and nonmagnetic layers 72 's are alternately stacked (refer to FIG. 20) has been found to exhibit a MR effect larger than the AMR effect and has been attracting considerable attention. Such a large MR effect is termed "giant magnetoresistance effect" (hereinafter referred to as "GMR effect"). Unlike the AMR effect, this GMR effect is independent of a current direction and is developed by the relative angle formed between the respective magnetizations of adjacent magnetic layers. The resistance assumes a maximum when the two magnetizations are oriented antiparallel to each other and a minimum when they are oriented parallel to each other. Herein, the term "antiparallel" means to indicate an alignment where the two magnetizations are oriented in opposite directions, while the term "parallel" means to indicate an alignment where they are oriented in the same direction.

A Fe/Cr multilayered film is known as an MR element utilizing the GMR effect (refer to, for example, Phys.Rev.Lett., Vol. 61, No. 21, 1988, pp. 2472-2475). In this Fe/Cr multilayered film the antiferromagnetic interaction between magnetic layers (Fe layers) 71's sandwiching a nonmagnetic layer (Cr layer) 72 develops the GMR effect by offering two alignments of antiparallel under a magnetic field being applied set at 0 and parallel under a magnetic field being applied set at a magnitude where magnetization is saturated. However, a problem exists in this multilayered film that the application of a magnetic field (saturation magnetic field) of 10 kOe or more (at room temperature) is required because of the interaction between the magnetic layers and this becomes a great hindrance in practical use.

A NiFe/Cu/Co/Cu multilayered film is also known as a MR element utilizing the GMR effect (refer to, for example, Journal of The Physical Society of Japan, Vol. 59, No. 9. September 1990, pp. 3061-3064). This multilayered film utilizes the difference in coercivity between two kinds of magnetic films to develop the GMR effect. Specifically, a nonmagnetic layer (Cu layer) is made sufficiently thick, for example, about 5 nm to substantially eliminate the interaction between magnetic layers, and a soft magnetic layer (NiFe layer) and a hard magnetic layer (Co layer) realize antiparallel alignment of magnetizations on the basis of the magnitude of a magnetic field to be applied. In this multilayered film, however, the nonmagnetic layer cannot be made so thin because the interaction between the magnetic layers needs to be eliminated. This results in a limited MR ratio of this multilayered film. Further, a change in resistance depends on the magnetization process of the soft and hard magnetic layers and, hence, cannot be positively controlled by a magnetic field applied. In addition, it is desired that the magnetoresistance curve (MR curve) of a MR element be changeable in configuration in accordance with applications of the MR element such as in a magnetic thin film memory and a magnetoresistance sensor (hereinafter referred to as "MR sensor").

A MR sensor disclosed in Japanese Unexamined Patent Publication No. 358310/1992 comprises a three-layered MR element comprised of the first and second ferromagnetic materials which are separated with a thin layer of a nonmagnetic metal. Such a MR element is designed so that the respective magnetization directions of the first and second ferromagnetic thin film layers would cross each other at right angles when a magnetic field applied thereto is set at 0. This MR sensor is described to have a certain inclination of a change in resistance due to rotation of the magnetization direction of the ferromagnetic material when a magnetic field applied is in the proximity of 0. Further, this sensor is characterized by obtaining the MR effect as the sum of the AMR effect and the GMR effect. The sensor, however, offers a small MR ratio though it is suitable as a sensor in view of its characteristics.

The aforementioned conventional single-layered MR element utilizing the AMR effect has a problem of a small rate of change in electrical resistance.

The aforementioned multilayered MR element such as made of Fe/Cr which utilizes the GMR effect requires a large magnetic field, as large as several kilo oersteds or more, to be applied and, hence, has a difficulty in practical use. Alternatively, the multilayered MR element such as made of NiFe/Cu/Co/Cu which utilizes the GMR effect based on the difference in coercivity between magnetic layers suffers a problem of a limited MR ratio in terms of absolute value since the nonmagnetic layer cannot be made so thin.

It is, therefore, an object of the present invention to overcome the foregoing problems and to provide a MR element for use in a magnetic thin film memory, which element utilizes a GMR effect offering a large rate of change in electrical resistance with a small change in the magnetic field, and a magnetic thin film memory employing such a MR element.

Another object of the present invention is to provide an MR element which utilizes a GMR effect offering a large rate of change in electrical resistance with a small change in the magnetic field, and a MR sensor employing such a MR element.

These and other objects will become apparent from the description hereinafter.

SUMMARY OF THE INVENTION

According to one aspect of the present invention, there is provided a magnetoresistive element comprising a substrate, and a basically three-layered structure provided on the substrate and having a first magnetic layer, a second magnetic layer and a nonmagnetic layer sandwiched between the first and second magnetic layers, wherein the first and second magnetic layers are such that respective magnetization directions thereof are oriented parallel or antiparallel to each other under a magnetic field applied thereto set at 0.

Another aspect of the present invention provides a magnetoresistive element comprising a substrate, and a basically three-layered structure provided on the substrate and having a first magnetic layer, a second magnetic layer and a nonmagnetic layer sandwiched between the first and second magnetic layers, each of the first and second magnetic layers being formed of $Fe_{1-x}Co_x$ ($0.5 \leq x \leq 1.0$), the three-layered structure further having a buffer layer provided between the substrate and the first magnetic layer and/or a cap layer provided on the second magnetic layer.

Another aspect of the present invention provides a magnetoresistive element comprising a substrate, and a basically five-layered structure provided on the substrate and having a first magnetic layer, a second magnetic layer, a third magnetic layer, which layers are stacked on the substrate in that order, a first nonmagnetic layer sandwiched between the first and second magnetic layers, and a second nonmagnetic layer sandwiched between the second and third magnetic layers, wherein under a magnetic field applied thereto set at 0, a magnetization direction of the first magnetic layer and that of the third magnetic layer are oriented parallel to each other while a magnetization direction of the second magnetic layer is oriented perpendicular to the magnetization directions of the first and third magnetic layers.

In the magnetoresistive element having the basically five-layered structure a change in electrical resistance is produced on the basis of a change in the magnetization direction of the second magnetic layer.

Also, in the magnetoresistive element having the basically five-layered structure a change in electrical resistance is produced on the basis of a change in the magnetization directions of the first and third magnetic layers.

Another aspect of the present invention yet provides a magnetoresistive element comprising a substrate, a basically five-layered structure having a first magnetic layer, a second magnetic layer, a third magnetic layer, which layers are stacked on the substrate in that order, a first nonmagnetic layer sandwiched between the first and second magnetic layers and a second nonmagnetic layer sandwiched between the second and third magnetic layers, and at least one of a buffer layer provided between the substrate and the first magnetic layer and a cap layer provided on the third magnetic layer.

Another aspect of the present invention yet provides a magnetic thin film memory comprising:

a magnetoresistive element formed of a substrate and a basically three-layered structure provided on the substrate and having a first magnetic layer, a second magnetic layer and a nonmagnetic layer sandwiched between the first and second magnetic layers, the first and second magnetic layers having magnetization directions oriented parallel or antiparallel to each other, means for producing electric current to flow through the magnetoresistive element, and means for sensing a change in electrical resistance of the magnetoresistive element.

According to yet another aspect of the present invention, there is provided a magnetoresistance sensor comprising:

a magnetoresistive element formed of a substrate, a basically three-layered structure provided on the substrate and having a first magnetic layer, a second magnetic layer and a nonmagnetic layer sandwiched between the first and second magnetic layers, each of the first and second magnetic layers Ming formed of $Fe_{1-x}Co_x$ ($0.5 \leq x \leq 1.0$), and a buffer layer provided between the substrate and the first magnetic layer and/or a cap layer provided on the second magnetic layer, means for producing electric current to flow through the magnetoresistive element, and means for sensing a change in electrical resistance of the magnetoresistive element as a function of a magnetic field to be sensed.

In the above magnetoresistance sensor, magnetization directions of the first and second magnetic layers are oriented perpendicular to each other under a magnetic field applied thereto set at 0.

According to yet another aspect of the present invention, there is provided a magnetoresistance sensor comprising:

a magnetoresistive element formed of a substrate and a basically five-layered structure provided on the substrate and having a first magnetic layer, a second magnetic layer, a third magnetic layer, a first nonmagnetic layer sandwiched between the first and second magnetic layers, and a second nonmagnetic layer sandwiched between the second and third magnetic layers, the first to third magnetic layers being stacked in that order, the first to third magnetic layers being such that under a magnetic field applied thereto set at 0, magnetization directions of the first and third magnetic layers are oriented parallel to each other while a magnetization direction of the second magnetic layer is oriented perpendicular to the magnetization directions of the first and second magnetic layers.

means for producing electric current to flow through the magnetoresistive element, and means for sensing a change in electrical resistance of the magnetoresistive element as a function of a magnetic field to be sensed.

The MR element according to the present invention is made to have a basically three-layered structure comprised of a first magnetic layer, a nonmagnetic layer and a second magnetic layer so as to minimize the interaction between the magnetic layers. Hence, the MR element offers a large MR effect in response to a sufficiently low magnetic field even if the nonmagnetic layer is made thin. Further, the MR element is constructed so that the magnetization directions of the first and second magnetic layers are oriented parallel or antiparallel to each other thereby obtaining MR characteristics suitable for a magnetic thin film memory.

If the buffer layer is provided between the substrate and the first magnetic layer, the buffer layer makes it possible to control the magnetization of the first magnetic layer while enhancing the MR effect.

If the cap layer is provided on the second magnetic layer, the cap layer makes it possible to control the magnetization of the second magnetic layer while serving as a protective layer of the MR element against oxidation and the like.

The provision of both the buffer layer and the cap layer enables control over the magnetizations of both the first and second magnetic layers and allows setting of a difference in the reversal field between these two layers as desired.

If each of the magnetic layers is formed of $Fe_{1-x}Co_x$ ($0.5 \leq x \leq 1.0$) and the nonmagnetic layer is formed of Cu, a very large MR effect can be obtained while the magnetization of each magnetic layer can be controlled by the additional layers such as buffer layer and cap layer. Hence, there can be obtained such a MR characteristic suitable for a MR sensor that a change in resistance is linear in response to a certain magnetic field range of which the center is 0.

The MR element according another aspect of the present invention is made to have a basically five-layered structure having a first magnetic layer, a nonmagnetic layer, a second magnetic layer, a nonmagnetic layer and a third magnetic layer to decrease the interaction between the magnetic layers. Hence, the MR element offers a large MR effect in response to a sufficiently low magnetic field even if the nonmagnetic layers are made thin. In addition the MR element is designed such that the magnetization directions of the first and third magnetic layers and that of the second magnetic layer are oriented perpendicular to each other and, hence, can be used in a MR sensor having an excellent linearity.

If the MR element of the five-layered structure is provided with a buffer layer between the first magnetic layer and/or a cap layer on the third magnetic layer, the magnetization of the first and/or third magnetic layer can be controlled while enhancing the MR effect with the MR element protected against oxidation and the like.

BRIEF DESCRIPTION OF THE DRAWINGS

FIG. 13 is a fragmentary plan view showing the configuration of one embodiment of a MR sensor according to the present invention;

DETAILED DESCRIPTION

A MR element, and a magnetic thin film memory and a MR sensor each utilizing the MR element according to the present invention will now be described by way of examples.

As described earlier, attempts have been made to utilize a GMR effect which appears depending on the relative angle formed between the respective magnetization directions of adjacent magnetic layers sandwiching a nonmagnetic layer by forming a multilayered film in which a magnetic layer and a nonmagnetic layer are alternately stacked. The present inventors have made intensive studies to develop a MR element offering a larger MR ratio than ever. As a result, they have developed a MR element offering a large MR ratio with respect to a low magnetic field of 5 to 30 Oe by employing not a multilayered structure having alternately stacked magnetic layers and nonmagnetic layers but a basically three-layered structure in which two magnetic layers sandwich a nonmagnetic layer to substantially eliminate the interaction between the magnetic layers and one of the magnetic layers is made magnetically soft with the other magnetic layer made relatively magnetically hard to make a difference in the reversal field of magnetization between the magnetic layers.

Figure 19:
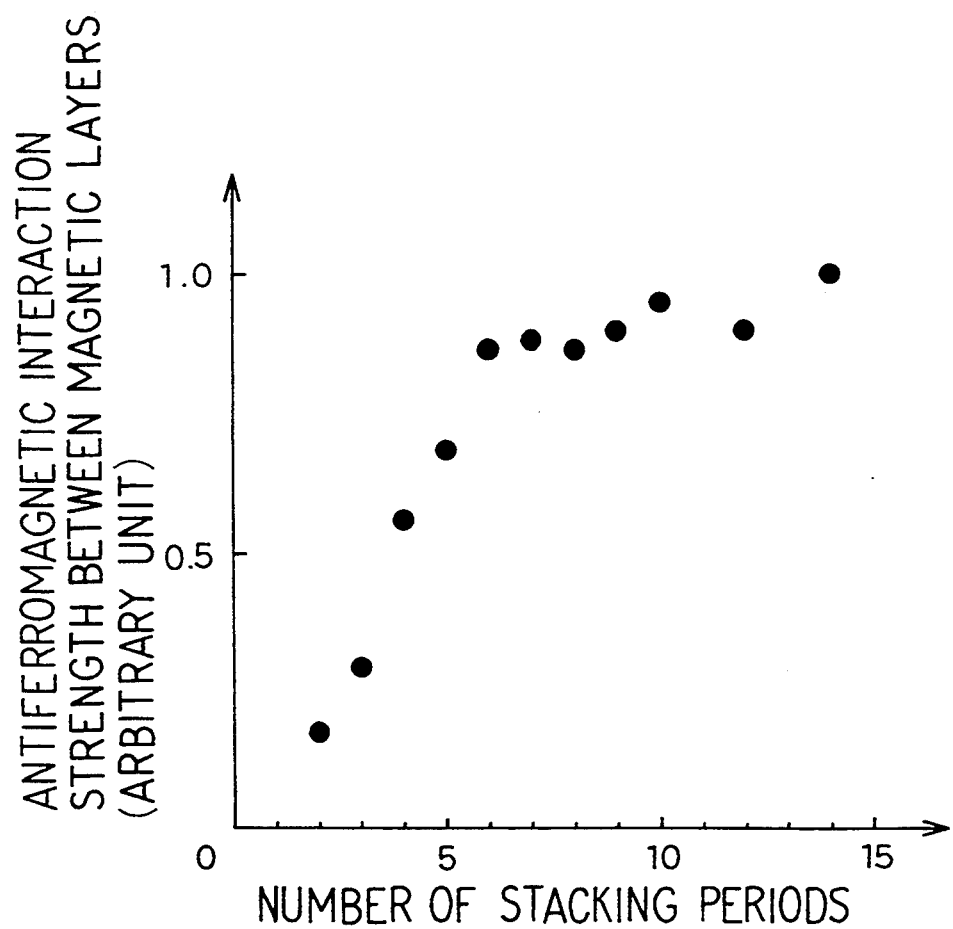
FIG. 19 is a graphic representation showing a change in the interaction strength between magnetic layers with varying stacking period of a multilayered film exhibiting a GMR effect.
Figure 20:
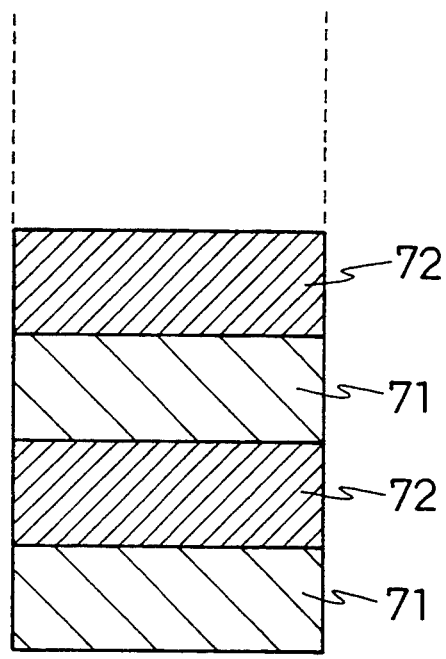
FIG. 20 is an explanatory section showing a prior art multilayered film exhibiting a GMR effect.

FIG. 19 shows an antiferromagnetic interaction characteristic between magnetic layers as the number of stacking periods is changed in a multilayered film exhibiting a GMR effect. In this figure the horizontal axis represents the number N of stacking periods, let a pair of a magnetic layer and a nonmagnetic layer be one stacking period, and the vertical axis represents a relative value (in an arbitrary unit) of the antiferromagnetic interaction strength between magnetic layers, let the interaction assume 1 when the number N of stacking periods is 15. As apparent from FIG. 19, the interaction between magnetic layers sharply increases with increasing number N of stacking periods. Therefore, a conventional approach to eliminate the interaction has been to make the nonmagnetic layer thick, or as thick as 5 nm or more. With such an approach, the influence of the interaction cannot completely eliminated while, in addition, there is caused a decrease in a MR ratio because of the nonmagnetic layer of increased thickness.

Figure 1:
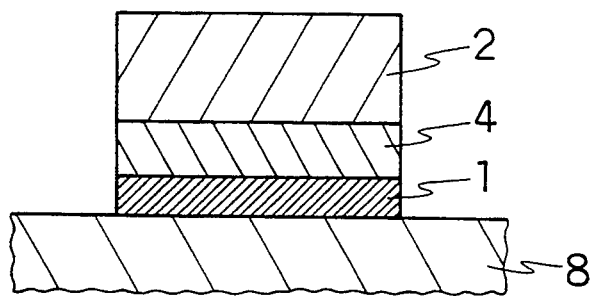
FIG. 1 is an explanatory section showing a MR element of three-layered structure as one embodiment of MR element according to the present invention.
Figure 6:
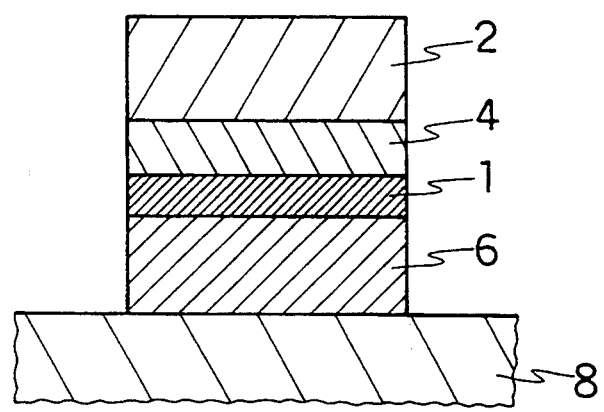
FIG. 6 is an explanatory section showing MR element of three-layered structure provided with a buffer layer as another embodiment of a MR element according to the present invention.
Figure 8:
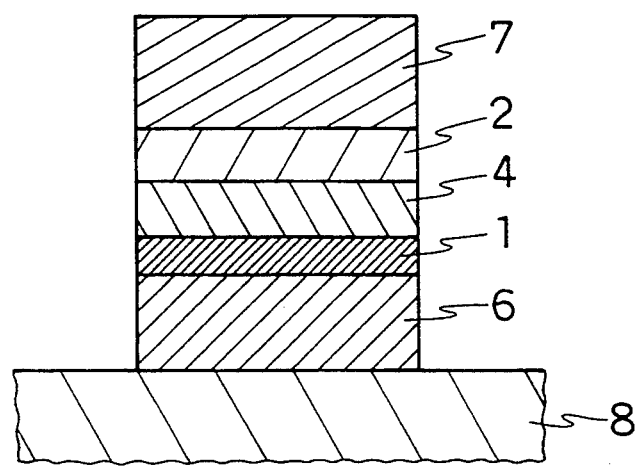
FIG. 8 is an explanatory section showing a MR element of three-layered structure provided with a buffer layer and a cap layer as yet another embodiment of a MR element according to the present invention.

FIG. 1 shows the basic structure of a MR element according to the present invention, in which a first magnetic layer 1 and a second magnetic layer 2 with an intervening nonmagnetic layer 4 are stacked on a substrate 8 formed of a glass plate, silicon substrate, oxide plate such as made of tantalum oxide, or the like. Materials suitable for the first magnetic layer 1 or the second magnetic layer 2 include 3d transition metals such as Ni, Fe and Co and alloys of these metals such as Ni—Fe alloy, Ni—Co alloy and Ni—Fe—Co alloy. Among these, especially preferable is Fe—Co alloy (containing 50 atm. % to 100 atm. % of Co) since it exhibit a high MR effect in cooperation with the nonmagnetic layer 4 to be described later. Also preferable are permanent magnet alloys such as Fe—Pt alloy and Co—Pt alloy as hard magnetic materials, and Fe- or Co-based amorphous alloys such as Fe—Hf—C alloy and Co—Zr—Nb alloy as soft magnetic materials. The first magnetic layer 1 and the second magnetic material layer 2 may each be of any material as far as there is a difference in reversal fields of magnetizations. Accordingly, in the combination of the first magnetic layer 1 and the second magnetic layer 2, if the first magnetic layer 1 is soft, the second magnetic layer 2 is composed of a relatively hard material selected from the materials mentioned above. Alternatively, as shown in FIGS. 6 and 8 to be described later, a magnetic layer may be provided as buffer layer 6 or cap layer 7 which is exchange-coupled with the first magnetic layer 1 or the second magnetic layer 2 to have a difference in the reversal field of magnetization between the first magnetic layer 1 and the second magnetic layer 2. Preferably, the first magnetic layer 1 and the second magnetic layer 2 each have a thickness of about 15 nm. If they are too thick, a shunt effect of current becomes heavy thereby reducing a MR effect.

Preferably metals of high conductivity such as Cu, Cr and noble metals like Ag, Au, Rh, Ru and Ir are suitable for the nonmagnetic layer 4 combined with each of the first magnetic layer 1 and the second magnetic layer 2. In general the nonmagnetic layer 4 preferably has a thickness of about 1 to about 4 nm. If it is too thin, the interaction between the first magnetic layer 1 and the second magnetic layer 2 becomes undesirably large so that it loses the effect of the present invention, while if it is too thick, a shunt effect of current becomes heavy, thus resulting in a decrease of the MR effect.

Each layer of the MR element of the present invention may be formed by any thin film formation process such as sputtering or high vacuum evaporation. The thickness of each layer may be controlled by a time-controlled open-close operation of a shutter. Further, the magnetic layers 1 and 2 are each imparted with magnetic anisotropy by, for example, applying a magnetic field of about 50 to 500 Oe in the plane of the film being formed or by heating the film in a magnetic field.

Figure 2:
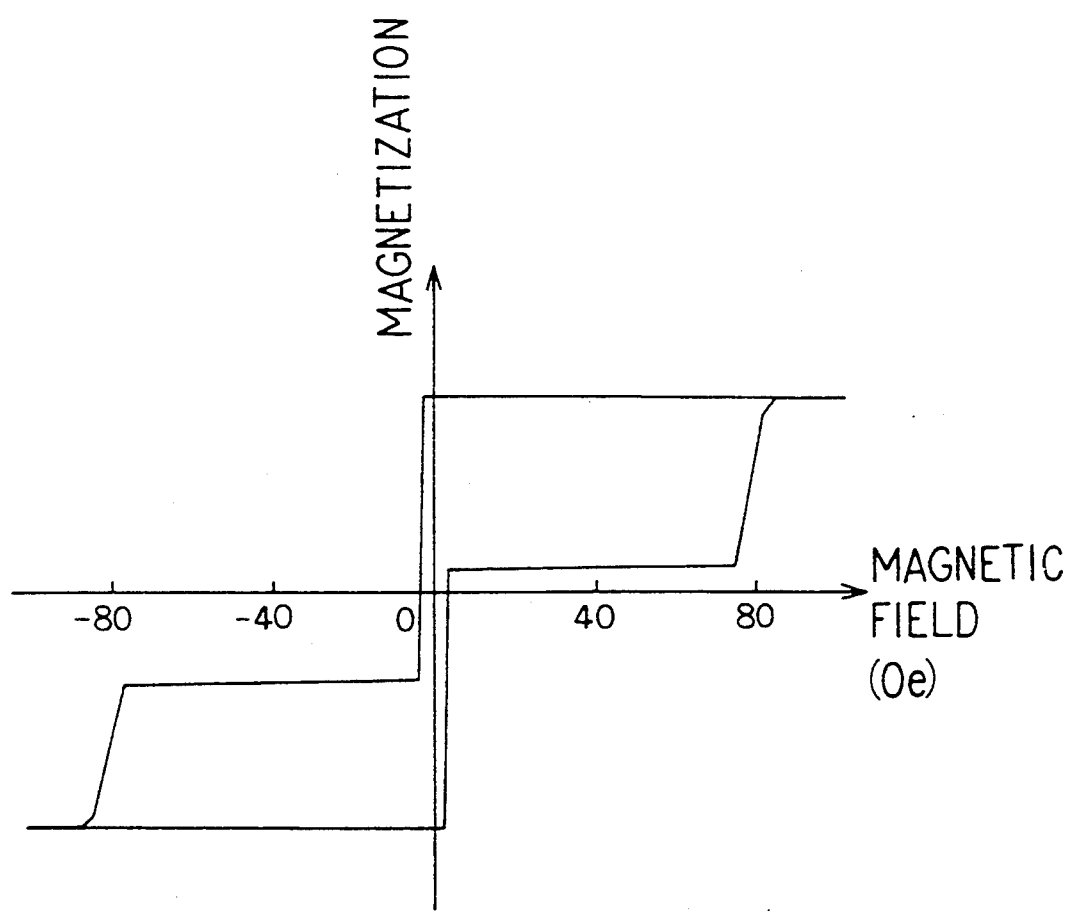
FIG. 2 is a diagrammatic representation showing a magnetization curve of one embodiment of a MR element constituting a magnetic thin film memory according to the present invention.
Figure 3:
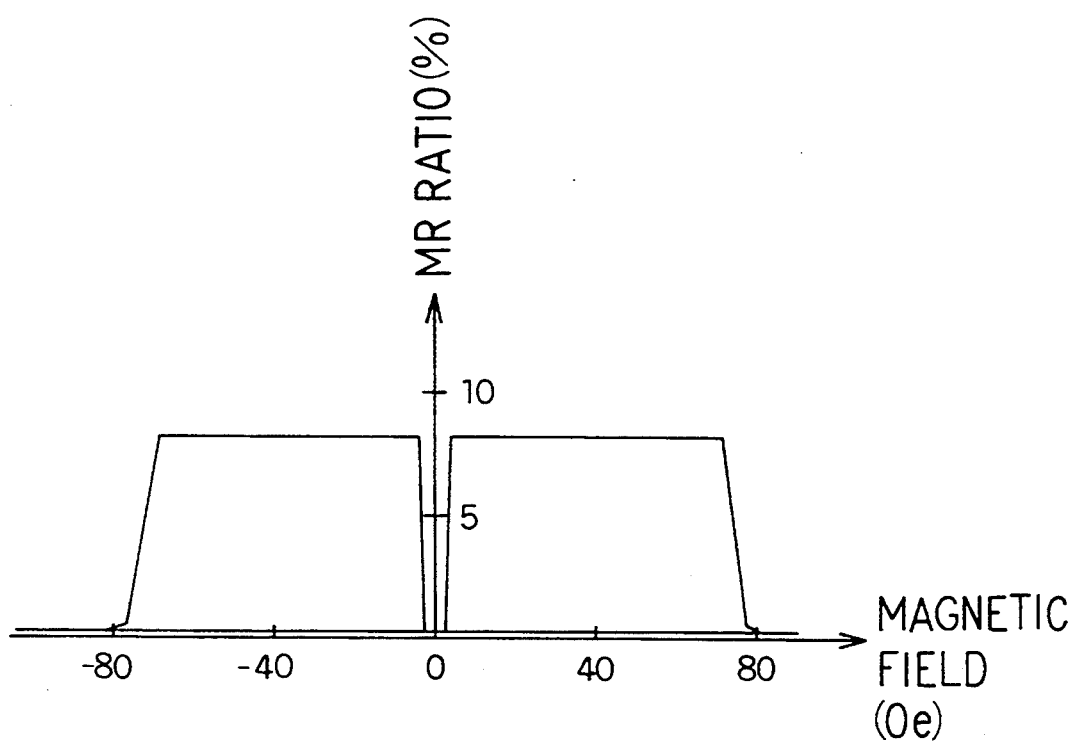
FIG. 3 is a diagrammatic representation showing a MR curve of one embodiment of an MR element constituting a magnetic thin film memory according to the present invention.

In MR element for use in a magnetic thin film memory according to the present invention the respective magnetization directions of the first and second magnetic layers 1 and 2 need to be oriented parallel or antiparallel to each other under a magnetic field applied thereto set at 0. For instance, there are provided the first magnetic layer 1 of $Ni_{66}Fe_{16}Co_{18}$ with a thickness of about 5.0 nm, the nonmagnetic layer 4 of Cu with a thickness of about 2.2 nm, and the second magnetic layer 2 of Co with a thickness of about 5.0 nm. The first and second magnetic layers 1 and 2 are, respectively, adapted to have easy magnetization axes oriented parallel to each other. FIG. 2 shows the magnetization curve, measured by vibrating sample magnetometer (VSM), of this MR element. In this case the measurement is conducted with a magnetic field applied along the easy magnetization axis. As seen from FIG. 2, the first and second magnetic layers 1 and 2 are realized to have magnetization directions oriented parallel or antiparallel to each other when a magnetic field applied thereto is 0. The reversal field of magnetization of the first magnetic layer 1 is about 6 Oe, while that of the second magnetic layer 2 is about 80 Oe. FIG. 3 shows the MR curve of this element. In this case a magnetic field is applied along the easy magnetization axis, too. Since the magnetization curve and the MR curve correspond well, it is apparent that the respective magnetization directions of the first and second magnetic layers 1 and 2 are varied independently of each other and that the magnetization direction of the first magnetic layer 1 is basically responsible for a MR ratio. Specifically, a large MR ratio as large as 8% is realized with a low magnetic field of about 6 Oe. The electrical resistance of the MR element changes depending on the relative angle formed between the respective magnetization directions of the first and second magnetic layers 1 and 2. The electrical resistance is maximized when the magnetization directions are oriented antiparallel to each other, and is minimized when they are oriented parallel to each other. In the MR element used herein, there is a large difference between the resistivity $\rho_0$ when the magnetization directions of the first and second magnetic layers 1 and 2 are parallel and the resistivity $\rho_1$ when the magnetization directions thereof are antiparallel, and they have the following relation:

$$(\rho_1 - \rho_0)/\rho_0 = 0.08$$

This means that the MR ratio is 8%.

With reference to FIGS. 4 and 5, a magnetic thin film memory in which MR elements described above are arranged in a matrix and record information using the magnetization direction of the first magnetic layer will be explained. FIGS. 4 and 5 are explanatory views of different embodiments of the magnetic thin film memory according to the present invention; in which FIGS.

Figure 4A:
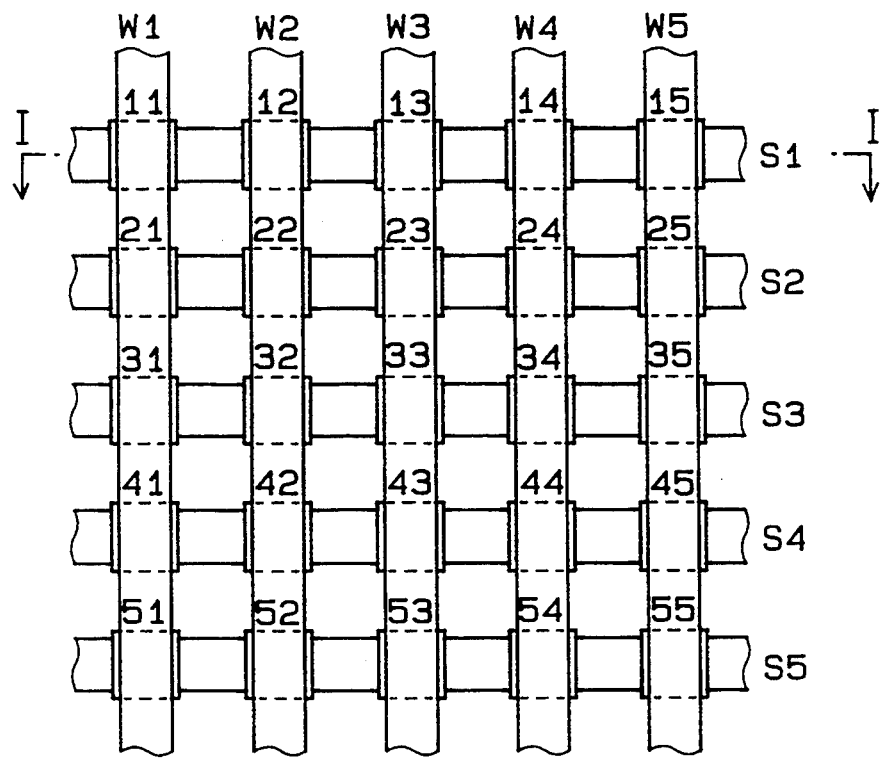
FIG. 4(a) is a plan view showing the configuration of one embodiment of a magnetic thin film memory according to the present invention.
Figure 4B:
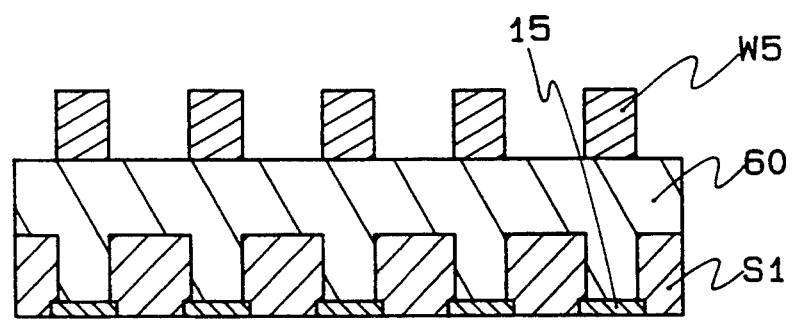
FIG. 4(b) is a sectional view taken along line I—I of FIG. 4(a)
Figure 5A:
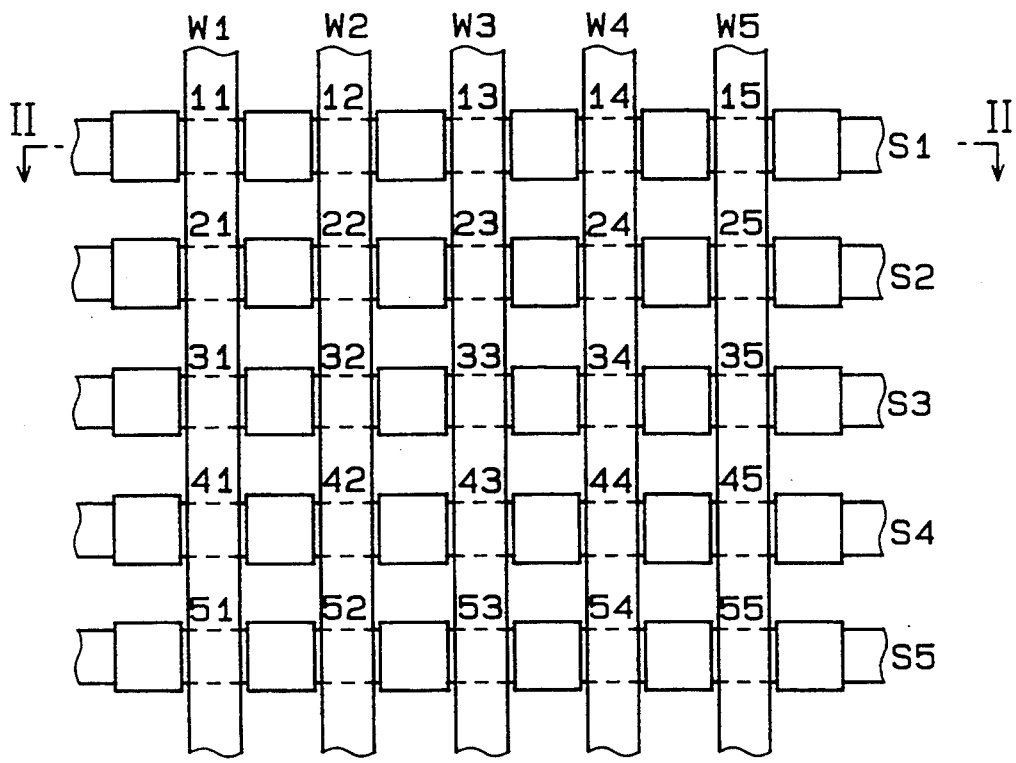
FIG. 5(a) is a plan view showing the configuration of another embodiment of a magnetic thin film memory according to the present invention.
Figure 5B:
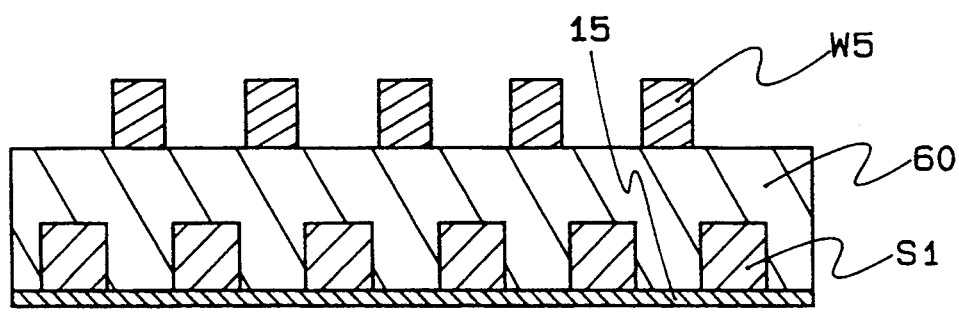
FIG. 5(b) is a sectional view taken along line II—II of FIG. 5(a)

4(a) and 5(a) are each a plan view, and FIGS. 4(b) and 5(b) are explanatory sections taken along line I—I of FIG. 4(a) and line II—II of FIG. 5(a), respectively. Each of the magnetic thin film memories comprises MR elements 11, 12 . . . arranged in a matrix, means for applying a magnetic field to these MR elements, including for example word lines W1, W2 . . . which are each provided adjacent to individual column of the MR elements and sense lines S1, S2 . . . each of which connects an individual row of the MR elements, means for producing current to flow through the MR elements 11, 12 . . ., including for example a power source (not shown) connected to the sense lines S1, S2 . . . , and means for sensing a change in resistivity of each of the MR elements 11, 12 . . . , including for example an instrument (not shown) for measuring a change in current or in voltage.

It should be noted that in the following description the terms "up", "down", "right" and "left" are used in terms of the plane of each of FIGS. 4 and 5. Each MR element is adapted to have an easy magnetization axis parallel to the sense line S1. Accordingly, the easy magnetization axis of each element extends horizontally in FIGS. 4 and 5. A recording state of "0" appears when the magnetization direction of the first magnetic layer is oriented to the left, while a recording state of "1" appears when the magnetization direction thereof is oriented to the right. In any recording state, the magnetization direction of the second magnetic layer is oriented to the left. Accordingly, the recording state depends on the magnetization direction of the first magnetic layer.

The recording procedure will be described specifically.

When a random access recording is to be performed with respect to, for example, MR element 11 in FIGS. 4 and 5, current is made to flow in the word line W1 and the sense line S1. Recording word current in the word line W1 produces a recording word magnetic field of about 5 Oe which is oriented to the left or the right. The orientation of the recording word magnetic field depends on whether the recording word current flows upward or downward. On the other hand, recording sense current in sense line S1 produces a recording sense magnetic field of about 5 Oe which is oriented upward or downward. Unlike the recording word current, the recording sense current need not be changed in flowing direction and is made to flow in such a direction as to orient the recording sense magnetic field upward, for example. Thus, MR element 11 is applied with the recording sense magnetic field and the recording sense magnetic field. The magnetization direction of the first magnetic layer prior to application of a magnetic field may be oriented to the left or the right because it is independent of the subsequent recording procedure. When the recording word magnetic field is oriented to the left, the composite magnetic field of the recording sense magnetic field and the recording word magnetic field is oriented to the upper left. At this time the magnetization direction of the first magnetic layer is also oriented to the upper left. When the magnetic field applied is removed (i.e., no current flows), the magnetization of the first magnetic layer is oriented to the right along the easy magnetization axis and becomes stable. Thus, recording of data "0" is completed. On the other side, when the recording word magnetic field is oriented to the right, the composite magnetic field of the recording sense magnetic field and the recording word magnetic field is oriented to the upper right. In this case, when the magnetic field applied is removed, the magnetization of the first magnetic layer is oriented to the right and becomes stable and, thus, recording of data "1" is completed. Thus, by changing the direction of the recording word current corresponding to 2-bit information to be recorded, recording based on the magnetization direction, to the right or the left, can be realized. Although a magnetic field is applied to some MR elements as well as MR element 11, they are applied with only one of the recording sense magnetic field and the recording word magnetic field. This is insufficient to reverse the magnetization direction of the first magnetic layer. Although the magnetization may be inclined a little upon application of a magnetic field, the initial magnetization (recording) state is resumed if the magnetic field is removed. The magnetization of the second magnetic field is always oriented to the left because of a sufficiently large magnetic field. This is the principle of recording.

The principle of reproduction will be described below.

When a random access reproduction is to be performed with respect to, for example, MR element 11, current is made to flow in the sense line S1 and the word line W1. A reproduction sense current in the sense line S1 and a reproduction word current in the word line W1 produce a reproduction sense magnetic field and a reproduction word magnetic field, respectively, at MR element 11. The reproduction sense magnetic field and the reproduction word magnetic field are each set at about 5 Oe which is equal to the recording sense magnetic field or the recording word magnetic field. Hence, as in the recording, magnetizations of MR elements other than MR element 11 will not be reversed by one of such magnetic fields. The reproduction word magnetic field is adapted to orient to the right. With respect to the recording state of "0" realized by orienting the magnetization of the first magnetic layer to the left, the magnetization of the first magnetic layer is reversed to the right. If the voltage across the sense line is measured, a change in resistance can be measured since a change in voltage is proportional to a change in resistance. After the measurement, the reproduction word magnetic field is made to orient to the left so that the magnetization of the first magnetic layer resumes its initial orientation, or to the left. On the other hand, with respect to the recording state of "1" realized by orienting the magnetization of the first magnetic layer to the right, magnetization reversal will not occur and, hence, no change in voltage across the sense line is observed. Thus, it is understood that a large change in voltage occurs only when the magnetization is oriented to the left. As shown in FIG. 4, although a plurality of MR elements are connected in series on the sense line, MR element other than MR element 11 are not applied with the reproduction word magnetic field and, hence, will not contribute to reproduction. In other words, only the data in MR element 11 is selectively reproduced. This is the principle of reproduction.

The present inventors have further made intensive studies on the aforementioned MR element of basically three-layered structure. As a result, it has been found that a large MR ratio, as large as 10% to 22%, can be obtained by using $Fe_{1-x}Co_x$ ($0.5 \leq x \leq 1.0$) for the first and second magnetic layers and that by providing a buffer layer 6 or a cap layer 7 so as to be exchange-coupled with the first magnetic layer 1 or the second magnetic layer 2 as shown in FIGS. 6 and 8, the reversal fields of magnetizations of the first and second magnetic layers 1 and 2 can be determined. In this case, Cu is especially preferable as the material of the nonmagnetic layer 4. Besides Cu, preferable for obtaining a high MR effect are Ag, Au, Rh, Ru, Cr, Ir and the like. The thickness of each of the magnetic layers 1 and 2 is dependent on whether or not the buffer layer 6 or the cap layer 7 is added and on the thickness thereof. However, in general a MR effect can be effectively obtained if the thickness of each magnetic layer is up to about 15 nm. If the first and second magnetic layers 1 and 2 are to thick, shunt of current occurs thereby reducing the MR effect. The nonmagnetic layer 4 preferably has 1 to 4 nm thickness. If the nonmagnetic layer 4 is too thin, the interaction between the first and second magnetic layers 1 and 2 becomes undesirably large, while if it is too thick, a shunting of the of current occurs thereby reducing the MR effect.

Further, with regard to the MR element of basically three-layered structured exhibiting a high MR effect wherein $Fe_{1-x}Co_x$ ($0.5 \leq x \leq 1.0$) is used for the magnetic layers 1 and 2 and Cu is used for the nonmagnetic layer 4, it has been found that by providing the buffer layer 6 and/or the cap layer 7 so as to be exchange-coupled with the first magnetic layer 1 and/or the second magnetic layer 2 to control the magnetization of the first magnetic layer 1 and/or the second magnetic layer 2, the highest MR effect can be obtained of good linearity with a sufficiently low magnetic field. If a MR sensor employs the MR element wherein the respective magnetization directions of the magnetic layers 1 and 2 are oriented substantially perpendicular to each other when a magnetic field applied thereto assumes 0, the MR sensor offers a high sensitivity.

The MR element of basically three-layered structure constituting the MR sensor of the present invention is basically of the same arrangement with the MR element constituting the magnetic thin film memory except for the magnetization directions of the magnetic layers 1 and 2 when a magnetic field applied thereto is set at 0. Therefore, the material for each layer and the layer arrangement can be selected in completely the same manner for the two types of elements.

The present inventors have further made intensive studies and found that a MR element of basically a five-layered structure having three magnetic layers 1a, 2a and 3a with intervening nonmagnetic layers 4 and 5 (refer to FIG. 15) also exhibits a high MR effect with a sufficiently low magnetic field. Specifically, the magnetizations of the first and third magnetic layers 1a and 3a are made to orient in the same direction, and the magnetization of the second magnetic layer 2a is made independent of the magnetizations of the first and third magnetic layers 1a and 3a. Further, either the pair of the first and third magnetic layers 1a and 3a or the second magnetic layer 2a is made magnetically soft and the other is made relatively hard thereby making a difference in reversal field of magnetization. Such MR element of a five-layered structure also may be provided with an additional layer such as a buffer layer 7 or a cap layer 6 between the substrate and the first magnetic layer 1 and on the third magnetic layer 3a, respectively. Such additional layers make it possible to enhance the MR effect and to make a difference in reversal field between the magnetization of the first and/or third magnetic layer and that of the second magnetic layer. It is particularly desired that the magnetization direction of the pair of magnetic layers 1a and 3a and that of the second magnetic layer 2a be perpendicular to each other when a magnetic field applied thereto is set at 0. However, they need not necessarily be perpendicular to each other. If only they are substantially perpendicular to each other, a MR sensor can be obtained of high sensitivity and of good linearity.

The MR element of a five-layered structure for use in the MR sensor of the present invention is of basically the same arrangement with the MR element for use in the magnetic thin film memory with a few exceptions such as the layer arrangement (the number of layers and thickness of each layer) and the magnetization direction of each layer when a magnetic field applied assumes 0. Therefore, the material for the individual layers can be selected in completely the same manner for the two types of elements.

In the MR element described above of the present invention, the exchange coupling force between the first, second and third magnetic layers does not work or is weak, and the magnitude thereof can be adjusted to obtain a high MR effect by selecting the combination of the materials for individual layers constituting the MR element and the thickness of each layer. Further, the sensitivity of the MR effect with respect to a magnetic field is also dependent on the combination of the materials for individual layers and the thickness of each layer. Cu, for example, generally cooperates with each of the aforementioned magnetic layers and offers excellent combinations such as Ni/Cu, Fe/Cu and Ni—Co alloy/Cu as well as Fe—Co alloy/Cu. Like Cu, Ag and Au cooperate with almost all the magnetic layers. Ru is generally compatible with 3d transition metals including Ni, Fe and Co and with alloys of these metals such as Ni—Co alloy, Ni—Fe alloy and Ni—Fe—Co alloy and cooperates with Co—Zr—Nb alloy too. Rh and Ir have substantially the same features as Ru. As for Cr, especially excellent combinations thereof include Fe/Cr and Co/Gr.

The MR element, magnetic thin film memory and MR sensor of the present invention will described in more detail by way of Examples.

EXAMPLES 1 to 8

A MR element as shown in FIG. 1 was constructed with materials for the first and second magnetic layers 1 and 2 being changed and examined for its charateristics.

First, Example 1 was constructed as having individual layers of the following materials and thicknesses:

| First magnetic layer | $Ni_{66}Fe_{16}Co_{18}$ | 5.0 nm |
|---|---|---|
| Nonmagnetic layer | Cu | 2.2 nm |
| Second magnetic layer | Co | 5.0 nm |

The first magnetic layer 1 and the second magnetic layer 2 were made to have easy magnetization axes oriented in the same direction in the planes thereof. When a magnetic field was applied to the element along the easy magnetization axis, a magnetization curve and MR curve were exhibited as shown in FIG. 2 and 3, respectively. The reversal field of magnetization of the first magnetic layer 1 was about 6 Oe, that of the second magnetic layer 2 was about 80 Oe, and a change of about 8% in resistance occurred due to independent magnetization reversals of the first and second magnetic layers. In this Example, the first magnetic layer 1 was formed of $Ni_{66}Fe_{16}Co_{18}$ which was magnetically softer than Co forming the second magnetic layer 2. This produced a difference in the reversal field of magnetization between the first and second magnetic layers 1 and 2. Thus, an antiparallel magnetization alignment was realized.

Although the structure of the MR element of this Example is very simple, it is one of the basic structures of the MR element of the present invention and exhibits excellent characteristics in MR ratio and magnetic field sensitivity (the lowest magnetic field required for obtaining a change in resistance). Table 1 shows results of examinations on Examples 2 to 8 using different materials for the first and second magnetic layers 1 and 2. In any of Examples, the nonmagnetic layer (about 2.2 nm thickness) was formed of Cu.

TABLE 1

| Ex. No. | First magnetic layer (thickness (nm)) | Second magnetic layer (thickness (nm)) | MR ratio (%) | Magnetic field sensitivity (Oe) |
|---|---|---|---|---|
| 2 | $Ni_{80}Fe_{20}(5)$ | Co (5) | 8 | 7 |
| 3 | $Co_{87}Zr_5Nb_8(5)$ | CO (5) | 6 | 5 |
| 4 | Co (5) | $Co_{87}Zr_5Nb_8(5)$ | 6 | 4 |
| 5 | $Fe_{10}Co_{90}(5)$ | Co (5) | 10 | 10 |
| 6 | $Fe_{10}Co_{90}(5)$ | $Co_{80}Pt_{20}(5)$ | 8 | 10 |
| 7 | $Fe_{10}Co_{90}(5)$ | $Fe_{54}Pt_{46}(5)$ | 6 | 10 |
| 8 | $Fe_{10}Co_{90}(5)$ | $Fe_{50}Co_{50}(5)$ | 8 | 10 |

EXAMPLE 9

In this Example, a buffer layer 6 is provided between substrate 8 and the first magnetic layer 1. The buffer layer 6 is, in its first function, exchange-coupled with the first magnetic layer 1 to make the first magnetic layer 1 relatively soft or hard as compared with the second magnetic layer 2 thereby the first and second magnetic layers 1 and 2 have a difference in the minimum intensity of magnetic field for magnetization. As a result, there can be selected such a material for the first magnetic layer 1 as to be in good compatibility with the nonmagnetic layer 4 and as to obtain a maximum MR effect. The second function of the buffer layer 6 is to enhance the MR effect. By selecting the characteristics, such as material and thickness, of the buffer layer 6, each layer can be optimized in crystal structure, grain size, texture and the like. In addition, the interface between adjacent layers can be made relatively smooth, which is of great importance for the nonmagnetic layer 4 being very thin.

The materials which implement both the first and second functions are Ni, Fe, Co, Ni—Fe alloy, Ni—Co alloy, Fe—Co alloy, Ni—Fe—Co alloy, a permanent magnet alloy such as Fe—Pt alloy or Co—Pt alloy as a hard magnetic material, and a Fe- or Co-based amorphous alloy such as Fe—Hf—C alloy or Co—Zr—Nb alloy as a soft magnetic material. In addition, like Fe—Pt alloy or Co—Pt alloy, an antiferromagnetic oxide such as NiO, FeO or CoO and an antiferromagnetic alloy such as Fe—Mn alloy are effective as a material to make the first magnetic layer 1 hard.

Alternatively, if the first and second magnetic layers 1 and 2, per se, are in soft-hard or hard-soft relation with each other, the buffer layer 6 needs to implement only the second function above. In this case the buffer layer 6 may be composed of a nonmagnetic material such as Cu, Ag, Au, Cr, Ti, Nb, Ta, Zr or Hf.

Figure 7:
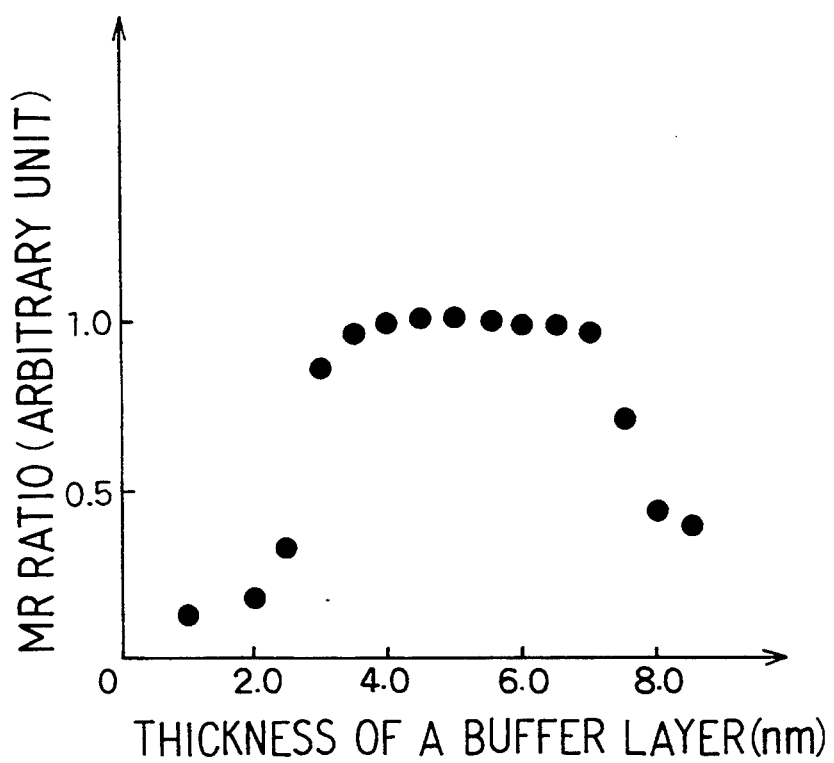
FIG. 7 is a graphic representation showing the relation between the thickness of the buffer layer and the MR effect in a MR element of Example 9.

In any case the buffer layer 6 needs to be as thin as possible so as to minimize the shunt effect of current in the MR element toward the buffer layer 6 while Ming thick enough to assure a continuous buffer layer and to optimize the state of each layer on the buffer layer 6. Therefore, as understood from FIG. 7 showing a MR ratio (MR effect) with the buffer layer 6 differently varied in thickness, the thickness of the buffer layer 6 is effective within the range of about 3 to about 7 nm. Although dependent on the type of the buffer layer, the effectiveness of the buffer layer 6 is recognized when the thickness thereof is within the range of about 3 to about 15 nm.

As Example 9, a MR element was constructed of the following arrangement on a glass substrate 8.

| Buffer layer | $Ni_{80}Fe_{20}$ | 5.0 nm |
|---|---|---|
| First magnetic layer | Co | 1.0 nm |
| Nonmagnetic layer | Cu | 2.2 nm |
| Second magnetic layer | Co | 5.0 nm |

Further, magnetic aniostropy was provided to the buffer layer 6, the first magnetic layer 1 and the second magnetic layer 2, and these layers were made to have easy magnetization axes oriented in the same direction. A strong exchange coupling force was exerted between the layers 1 and 6 and, hence, the respective magnetization directions of the layers 1 and 6 were always oriented parallel to each other. On the other hand, since the first and second magnetic layers 1 and 2 were spaced apart with the nonmagnetic layer 4, the exchange coupling force therebetween was not exerted or was very weak. Accordingly, the respective magnetization directions of the buffer layer 6 and the first magnetic layer 1 always moved together and were independent of that of the second magnetic layer 2. Therefore, when the movement of magnetization directions is considered, the MR element of this Example is of a basically three-layered structure comprising the first magnetic layer 1, the nonmagnetic layer 4 and the second magnetic layer 2.

This MR element offered a MR ratio as large as 15% with a low magnetic field of about 8Oe as shown in FIGS. 2 and 3.

EXAMPLES 10 to 17

Other examples of the MR element having a buffer layer 6 provided between the substrate 8 and the magnetic layer 1 are described below.

Different magnetic materials were used for each of the buffer layer 6, the first magnetic layer 2 and the second magnetic layer g. The examined characteristics of the resultant MR elements were as shown in Table 2. It is noted that the magnetic layers 1 and 2 and the buffer layer 6 were made to have easy magnetization axes oriented in the same direction, and that in any case a Cu layer having a thickness of about 2.2 nm was formed as the nonmagnetic layer 4. Further, when a magnetic field was applied to each of the MR element along the easy magnetization axis, the MR elements exhibited MR curve as shown in FIG. 3. This is because the respective magnetization directions of the buffer layer 6 and the first magnetic layer 1 were oriented in the same direction due to the strong exchange coupling force exerted therebetween while the second magnetic layer 2 spaced apart from these layers by the nonmagnetic layer 4 was independently magnetized due to no or little exchange coupling force exerted between the first and second magnetic layers 1 and 2. The reversal field of magnetization was about 5 to about 30 Oe.

These MR elements were recognized to have greater MR effect and a MR ratio as large as about 8% to about 22%. Thus, using Fe for the buffer layer 6 enhances the MR effect significantly.

TABLE 2

| Ex. No. | Buffer layer (thickness (nm)) | First/second magnetic layer (thickness (nm)) | MR ratio (%) | Magnetic field sensitivity (Oe) |
|---|---|---|---|---|
| 10 | Fe (5) | Co (1) /Co (5) | 20 | 30 |
| 11 | $Ni_{66}Fe_{16}Co_{18}$(5) | Co (1) /Co (5) | 15 | 8 |
| 12 | $Co_{87}Zr_5Nb_8$(5) | Co (3) /Co (5) | 11 | 5 |
| 13 | $Fe_{54}Pt_{46}$(5) | $Fe_{10}Co_{90}$(1)/ $Fe_{10}Co_{90}$(5) | 20 | 10 |
| 14 | NiO (8) | $Fe_{10}Co_{90}$(3)/ $Fe_{10}Co_{90}$(5) | 18 | 10 |
| 15 | Fe (5) | $Fe_{10}Co_{90}$(1)/ $Fe_{10}Co_{90}$(5) | 22 | 10 |
| 16 | Fe (5) | $Fe_{10}Co_{90}$(1)/ $Ni_{66}Fe_{16}Co_{18}$(5) | 12 | 6 |
| 17 | Fe (5) | $Fe_{10}Co_{90}$(1)/ $Co_{87}Zr_5Nb_8$(8) | 11 | 5 |

EXAMPLE 18

A MR element was constructed of the following three-layered structure with a buffer layer 6 formed of a nonmagnetic Cr layer having a thickness of about 5.0 nm. The use of a nonmagnetic material for the buffer layer 6 serves a purpose of enhancing the MR effect only. For this reason, as in the following, the first and second magnetic layers 1 and 2 were, respectively, formed of magnetic materials so that the first and second magnetic layers 1 and 2 have a difference in the reversal field of magnetization. As a result, the MR element offered a magnetic field sensitivity of 6 Oe and a MR ratio as large as 11%.

| Buffer layer | Cr | 5.0 nm |
|---|---|---|
| First magnetic layer | $Ni_{80}Fe_{20}$ | 1.5 nm |
| Nonmagnetic layer | Cu | 2.2 nm |
| Second magnetic layer | Co | 5.0 nm |

Preferably, the material for the first magnetic layer 1 is in good compatibility with the buffer layer 6.

EXAMPLE 19

This Example is characterized by the provision of a cap layer 7 on the second magnetic layer 2 as shown in the explanatory section of FIG. 8. Although the MR element shown in FIG. 8 has a buffer layer 6 provided between the first magnetic layer 1 and the substrate 8, the buffer layer 6 is not an indispensable component in this Example. The function of the cad layer 7 is to provide a difference the reversal field of magnetization between the first and second magnetic layers 1 and 2. That is, the cap layer 7 has a function similar to one of the functions of the buffer layer 6 as previously described. Therefore, if the cap layer 7 is formed of a material having the other function of the buffer layer 6, i.e., the function of enhancing the MR effect, a MR element may be constructed of a reversed structure in which the cap layer 7 having a necessary and sufficient thickness is first formed on the substrate 8 and other layers are then sequentially stacked thereon.

Materials which are effective for the cap layer 7 are similar to those for the buffer layer 6. Such materials include Ni, Fe, Co, Ni—Fe alloy, Ni—Co alloy, Fe—Co alloy, Ni—Fe—Co alloy, a permanent magnet alloy such as Fe—Pt alloy or Co—Pt alloy as a hard magnetic material, and a Fe- or Co-based amorphous alloy such as Fe—Hf—C alloy or Co—Zr—Nb alloy as a soft magnetic material. Further, like Fe—Pt alloy or Co—Pt alloy, an antiferromagnetic oxide such as NiO, FeO or CoO and an antiferromagnetic alloy such as Fe—Mn alloy are effective as a material that makes the second magnetic layer 2 magnetically hard. When one of these magnetic materials is used for the cap layer 7, the magnetization of the cap layer 7 can be used to control the magnetization of the second magnetic layer 7. Also, the cap layer 7 serves as a protective layer against oxidation of the MR element.

A MR element as a specific example was constructed of the following arrangement on a glass substrate.

| Buffer layer | Fe | 4.0 nm |
|---|---|---|
| First magnetic layer | $Fe_{10}Co_{90}$ | 1.0 nm |
| Nonmagnetic layer | Cu | 2.2 nm |
| Second magnetic layer | $Fe_{10}Co_{90}$ | 1.0 nm |
| Cap layer | $Ni_{66}Fe_{16}Co_{18}$ | 4.0 nm |

The buffer layer 6, the first magnetic layer 1, the second magnetic layer 2 and the cap layer 7 were, respectively, made to have easy magnetization axes oriented in the same direction. When a magnetic field was applied to the MR element along the easy magnetization axis, a MR curve was obtained as having the same form as in FIG. 3. The respective magnetization directions of the buffer layer 6 and first magnetic layer 1 were oriented in the same direction due to a strong exchange coupling force exerted therebetween while those of the cap layer 7 and second magnetic layer 2 were oriented in the same direction. Further, the first and second magnetic layers 1 and 2 were independently magnetized since they are spaced apart from each other by the nonmagnetic layer 4. When the movement of magnetizations is scrutinized, the MR element is thought to be of a basically three-layered structure constructed of the first magnetic layer 1, the nonmagnetic layer 4 and the second magnetic layer 2. Since Fe was magnetically harder than $Ni_{66}Fe_{16}Co_{18}$, the first magnetic layer 1 was magnetically harder than the second magnetic layer 2. The respective reversal field of magnetization of the first and second magnetic layers were about 25 Oe and about 7 Oe, respectively. Accordingly, only the magnetization direction of the second magnetic layer 2 moved when a low magnetic field was applied within a range of less than 25 Oe.

Figure 9:
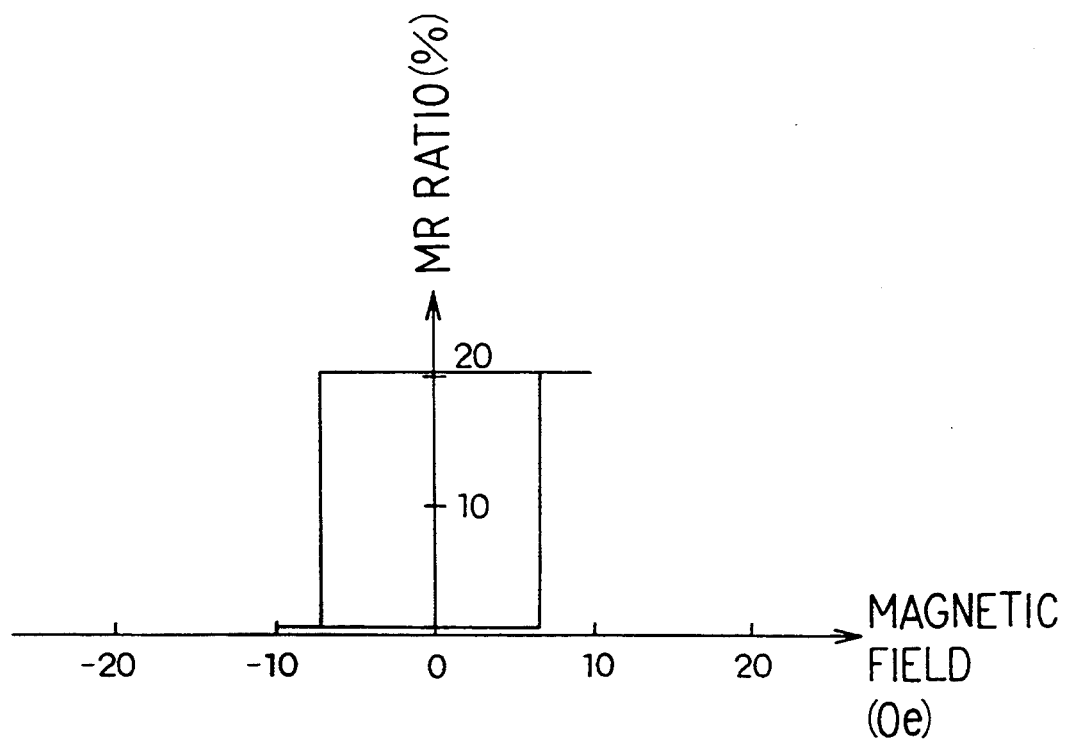
FIG. 9 is a diagrammatic representation showing a MR curve (minor loop) of an MR element of Example 19.

FIG. 9 shows a MR curve of the MR element when a magnetic field was applied within the range of ±10 Oe along the easy magnetization axis. The MR curve was due to a change in magnetization direction of the second magnetic layer 2. This MR element offered a high MR ratio as high as 20%.

EXAMPLES 20 TO 29

Figure 10:
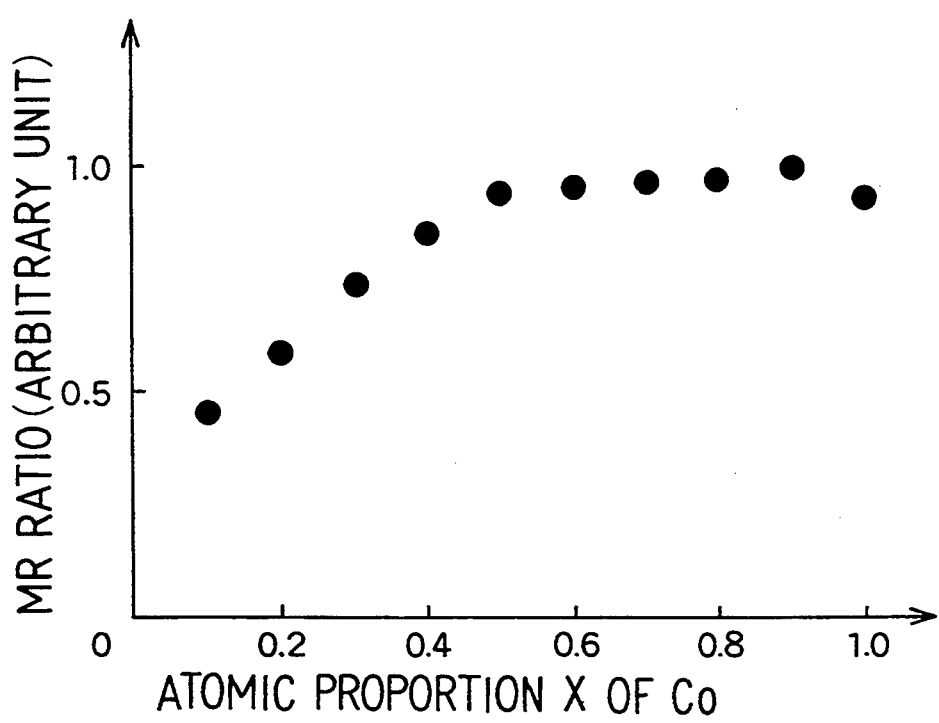
FIG. 10 is a graphic representation showing the relation between the content x of Co and the MR effect in the MR element of Example 19 in which the magnetic layer is composed of $Fe_{1-x}Co_x$ and the nonmagnetic layer is composed of Cu.

One major factor that develops a high MR effect as in Example 19 is the combination of the magnetic layers and the nonmagnetic layer. The present inventors have found that when $Fe_{1-x}Co_x$ is used for the magnetic layer in the case of the nonmagnetic layer being of Cu, a large change in resistance occurs depending on the value x, or the atomic proportion of Co. For instance, in the case that $Fe_{1-x}Co_x$ is used for the magnetic layers in Example 19, a MR ratio thereof varies as the proportion x of Co varies as shown in FIG. 10. In FIG. 10 the horizontal axis represents the proportion x of Co, while the vertical axis represents a relative value (in arbitrary units) assuming 1 when x=0.9. As apparent from FIG. 10, the proportion x is preferably within the range of $0.5 \leq x \leq 1.0$. Since this characteristic hardly depends on the material of the buffer layer 6 or the cap layer 7, the respective reversal fields of magnetizations of the first and second magnetic layers can be determined by the buffer layer 6 and cap layer 7 while maintaining a high MR effect. The following Table 3 shows examples of the combination of the buffer layer 6 and the cap layer 7 with the combination of the magnetic layers and the nonmagnetic layer being set as $Fe_{10}Co_{90}$ (1.0 nm thick)-/Cu (2.2 nm thick)/$Fe_{10}Co_{90}$ (1.0 nm thick).

TABLE 3

| Ex. No. | Buffer layer (thickness (nm)) | Cap layer (thickness (nm)) | MR ratio (%) | Magnetic field sensitivity (Oe) |
|---|---|---|---|---|
| 20 | Fe (4) | $Ni_{80}Fe_{20}$(4) | 18 | 7 |
| 21 | Fe (4) | $Co_{87}Zr_5Nb_8$(5) | 16 | 5 |
| 22 | Fe (4) | $Fe_{50}Mn_{50}$(8) | 21 | 25 |
| 23 | $Fe_{81}Cr_{19}$(5) | $CO_{87}Zr_5Nb_8$(5) | 12 | 5 |
| 24 | $Fe_{70}Co_{30}$(4) | $Fe_{50}Mn_{50}$(8) | 18 | 15 |
| 25 | $Fe_{54}Pt_{46}$(4) | $Ni_{80}Fe_{15}Co_5$(4) | 15 | 7 |
| 26 | $Ni_{66}Fe_{16}Co_{18}$(5) | $Fe_{50}Mn_{50}$(8) | 16 | 7 |
| 27 | $Co_{87}Zr_5Nb_8$(5) | $Fe_{50}Mn_{50}$(8) | 12 | 5 |
| 28 | $Fe_{50}Mn_{50}$(8) | $Ni_{66}Fe_{16}Co_{18}$(4) | 10 | 7 |
| 29 | Ta (5) | CoO (8) | 14 | 15 |

As apparent from Table 3, the use of $Fe_{10}Co_{90}$ and Cu respectively for the first and second magnetic layers and the nonmagnetic layer makes it possible to give a high MR ratio, while an appropriate selection of the materials for the buffer layer 6 and the cap layer 7 enables the magnetic field sensitivity to be selected as desired.

EXAMPLES 30 AND 31

With the MR element of the present invention a GMR effect can easily be obtained by making a difference in the reversal field of magnetization between the magnetic layers 1 and 2 since the coupling force between the magnetic layers 1 and 2 is basically weak. As a method for effectively making such a difference, the magnetization of the first magnetic layer 1 or the second magnetic layer 2 is preferably fixed with respect to the magnetic field.

In the arrangement shown in FIG. 8, for example, the buffer layer 6 or the cap layer 7 may be formed of a material of high coercivity, especially a permanent magnet such as a Co—Pt alloy or a Fe—Pt alloy so to fix the magnetization of the first magnetic layer 1 or the second magnetic layer 2. A specific example of such an arrangement was as follows (Example 30).

| First magnetic layer | $Ni_{80}Fe_{20}$ | 5.0 nm |
|---|---|---|
| Nonmagnetic layer | Cu | 2.2 nm |
| Second magnetic layer | $Ni_{80}Fe_{20}$ | 2.0 nm |
| Cap layer | $Co_{80}Pt_{20}$ | 4.0 nm |

The first magnetic layer 1 and the cap layer 7 were, respectively, made to have easy magnetization axes oriented in the same direction in the planes thereof. The cap layer 7 was formed of a permanent magnet of $Co_{80}Pt_{20}$ and a strong exchange coupling force worked between the cap layer 7 and the second magnetic layer 2. Hence, the magnetization of the second magnetic layer 2 was fixed with respect to the magnetic field.

Alternatively, the buffer layer 6 or the cap layer 7 may be formed of an antiferromagnetic material for example an oxide such as NiO, FeO or CoO, or a Fe—Mn alloy, which gives exchange anisotropy to the first or second magnetic layer adjacent thereto. A specific example of such an arrangment was as follows (Example 31).

| First magnetic layer | $Ni_{80}Fe_{20}$ | 5.0 nm |
|---|---|---|
| Nonmagnetic layer | Cu | 2.2 nm |
| Second magnetic layer | $Ni_{80}Fe_{20}$ | 2.0 nm |
| Cap layer | NiO | 8.0 nm |

The first magnetic layer 1 and the cap layer 7 were, respectively, made to have easy magnetization axes oriented in the same direction in the planes thereof. The cap layer 7 was formed of an antiferromagnetic material of NiO and a strong exchange coupling force worked between the cad layer 7 and the second magnetic layer 2. Hence, the magnetization of the second magnetic layer 2 was fixed with respect to the magnetic field.

EXAMPLE 32

Figure 11:
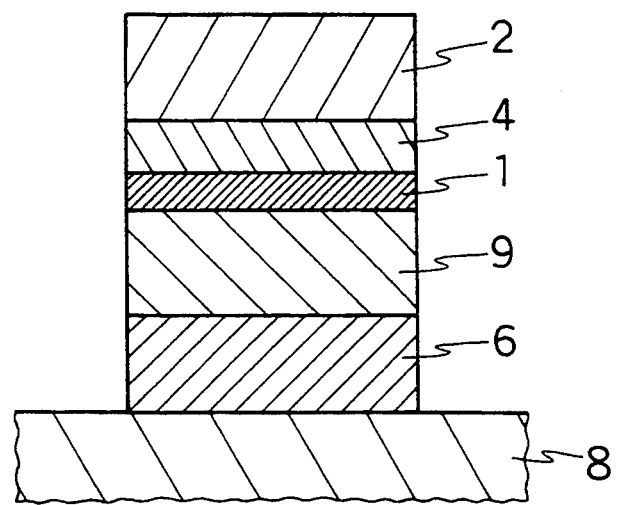
FIG. 11 is an explanatory section showing a MR element provided with an intermediate supplementary layer as another embodiment of a MR element according to the present invention.
Figure 12:
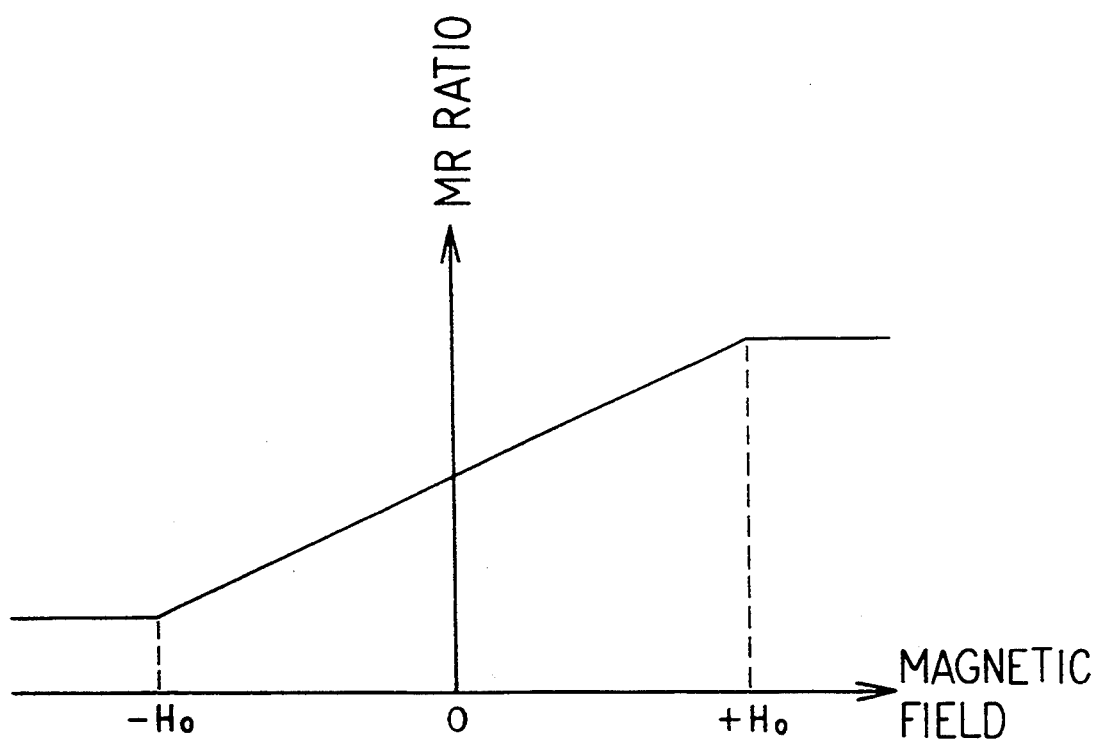
FIG. 12 is a diagrammatic representation showing a MR curve required for an MR element constituting a magnetic field sensor.

This Example is characterized by the provision of an intermediate supplementary layer 9 between the first magnetic layer 1 and the buffer layer 6 as shown in the sectional view of FIG. 11. The intermediate supplementary layer serves to control the magnetization of the first magnetic layer 1. In detail, the buffer layer 6 is imparted with functions of optimizing the crystal structure, grain size and texture of the individual layers forming the MR element and planarizing the interface between the adjacent layers, while the intermediate supplementary layer 9 controls the magnetization direction of the first magnetic layer 1.

The intermediate supplementary layer 9 may be formed of any of the aforementioned soft or hard magnetic materials usable for the buffer layer or the cap layer and preferably has a thickness of 3 to 15 nm. If it is too thin, the continuity of this layer is deteriorated and the condition of each layer cannot be optimized, while if it is too thick, the shunt effect of current increases thereby decreasing the MR effect.

A specific example of the MR element was contructed of the following arrangement.

| Buffer layer | Hf | 5.0 nm |
|---|---|---|
| Intermediate supplementary layer | $Fe_{50}Mn_{50}$ | 7.0 nm |
| First magnetic layer | $Ni_{80}Fe_{20}$ | 3.0 nm |
| Nonmagnetic layer | Cu | 2.2 nm |
| Second magnetic layer | $Ni_{80}Fe_{20}$ | 4.0 nm |

The intermediate supplementary layer 9 and the second magnetic layer 2 were, respectively, made to have easy magnetization axes oriented in the same direction in the planes thereof. The intermediate supplementary layer 9 was formed of an antiferromagnetic material of FesoMnso and a strong exchange coupling force worked between the intermediate supplementary layer 9 and the first magnetic layer 1. Hence, the first magnetic layer 1 was made magnetically hard. The intermediate supplementary layer 9 was an additional layer which aimed to control the magnetization of the first magnetic layer 1. When the movement of magnetizations is scrutinized, this MR element is of a basically three-layered structure comprising the first magnetic layer 1, the nonmagnetic layer 4 and the second magnetic layer 2. As a result of examinations on the characteristics of this Example, the magnetic field sensitivity was 6 Oe and the MR ratio was 6%.

EXAMPLE 33

A magnetic thin film memory was constructed by arranging MR elements of the type described in Example 9 in a matrix array as shown in FIGS. 4(a) and 4(b). As means for applying a magnetic field to each of the elements, there were provided sense lines S1, S2 . . . which connected MR element 11, 12 . . . , 21, 22 . . . in individual rows and word lines W1, W2 . . . adjacent to individual columns of MR elements through which current flows. This memory was designed that when current flows in individual MR elements 11, 12 . . . through the sense lines, a change in resistance was detected for individual MR elements. Each MR element was made to have easy magnetization axis oriented parallel to the sense line. As a result, the magnetization direction of the second magnetic layer was always oriented to the left and a recording was achieved on the basis of the magnetization direction of the first magnetic layer; i.e., data "0" was recorded when the magnetization direction of the first magnetic layer was oriented to the left while data "1" was recorded when such magnetization direction was oriented to the right. The word magnetic field and the sense magnetic field were both set at 6 Oe so that recorded data was reproduced by composed the magnetic fields thereof. Although in this Example MR elements 11, 12 . . . were each made to have easy magnetization axis oriented parallel to the sense lines S1, S2 . . . , the easy magnetization axis of each element may be made to orient parallel to word lines W1, W2 . . . In that case, by changing the direction of sense current so as to change the orientation of a magnetic field to be applied along the word lines, record/reproduction can be achieved as in this Example.

EXAMPLE 34

FIGS. 5(a) and 5(b) are explanatory view of an alternative example of the magnetic thin film memory. When this memory is compared with Example 33 shown in FIGS. 4(a) and 4(b), MR elements 11, 12 . . . are not patterned into square elements spaced from each other but into strips, and other features are substantially similar to those of Example 33. With this arrangement, if sense lines S1, S2 . . . are formed of a material more conductive than the MR elements 11, 12 . . . and made to be thicker, current mostly flows in sense lines not in the MR elements adjacent thereto. Therefore, even if the MR elements 11, 12 . . . are not separated from each other, they each vary in resistance independently and, hence, can be virtually regarded as elements of square chips. Such an arrangement also provides better individual contacts between the sense lines S1, S2 . . . and MR elements 11, 12 . . . , and offers an advantage of less unevenness or the like in the process.

EXAMPLE 35

Although the MR element are used as a magnetic recording element in Examples 1 to 32, it is used as a magnetic field sensing element in this Example.

A MR sensor, which is a magnetic field sensor utilizing a MR effect, needs to have such a characteristic that a change in resistance is linear with respect to a certain magnetic field range of which the center is 0.

A basic structure of the MR sensor is shown in FIG. 13. The MR sensor comprises a MR element 10 having leads 61 and 62 on its opposite ends, the leads serving to make current in the MR element 10, for example a power source (not shown), and means for sensing a change in electrical resistivity of the MR element 10, for example an instrument for sensing a change in current or voltage (not shown). In this Example the MR element 10 is of the same arrangement with Example 19 shown in FIG. 8. Materials and thicknesses of individual layers were as follows.

| Buffer layer | Fe | 4.0 nm |
| First magnetic layer | $Fe_{10}Co_{90}$ | 1.0 nm |
| Nonmagnetic layer | Cu | 2.2 nm |
| Second magnetic layer | $Fe_{10}Co_{90}$ | 1.0 nm |
| Cap layer | $Ni_{66}Fe_{16}Co_{18}$ | 4.0 nm |

The buffer layer 6 and the first magnetic layer 1 were made to have easy magnetization axes oriented in the same direction in the planes thereof. Similarly, the second magnetic layer 2 and the cap layer 7 were made to have easy magnetization axes oriented in the same direction in the planes thereof. In this case the respective easy magnetization axes of the buffer layer 6 and the cap layer 7 (or the first and second magnetic layers 1 and 2) were made perpendicular to each other.

As described in Example 19, since Fe was magnetically harder than $Ni_{66}Fe_{16}Co_{18}$, the first magnetic layer was magnetically harder than the second magnetic layer 2. When magnetic fields were applied to the first and second magnetic layers 1 and 2 along the easy magnetization axes, respectively, the reversal fields of magnetizations of the first and second magnetic layers were about 25 Oe and about 7 Oe, respectively. Accordingly, only the magnetization of the second magnetic layer 2 was moved at a low magnetic field within the range less than 25 Oe.

Figure 14:
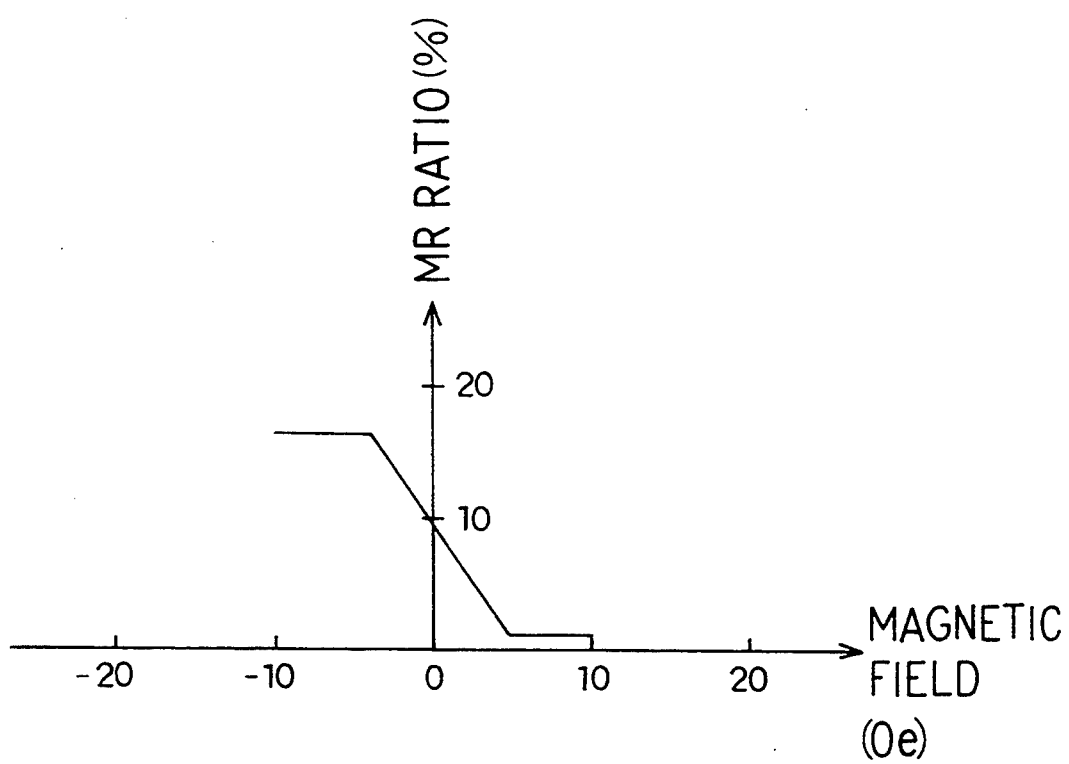
FIG. 14 is a diagrammatic representation showing a MR curve (minor loop) of a MR element of Example 35.

FIG. 14 shows the MR curve of this Example within the range of ±10 Oe. A magnetic field was applied along the easy magnetization axis of the first magnetic layer 1. When a magnetic field is set at 0, the magnetization direction of the second magnetic layer 2 was perpendicular to that of the first magnetic layer 1. When a magnetic field was applied, the magnetization direction of the second magnetic layer 2 was rotated in the plane thereof to vary in relative angle formed between the magnetization directions of the first and second magnetic layers 1 and 2 whereby a change in resistance occurred. A linear change in resistance was observed at a magnetic field within the range of ±4 Oe of which the center was substantially 0. A MR ratio per unit magnetic field was high, or as large as 2%/Oe.

Further, when the intensity of the magnetic field was swept up and down 1000 times or more within this range, the MR curve shown in FIG. 14 was repeated exactly, and thus, this MR element was found to have satisfactory characteristics for an MR sensor.

EXAMPLE 36

Figure 15:
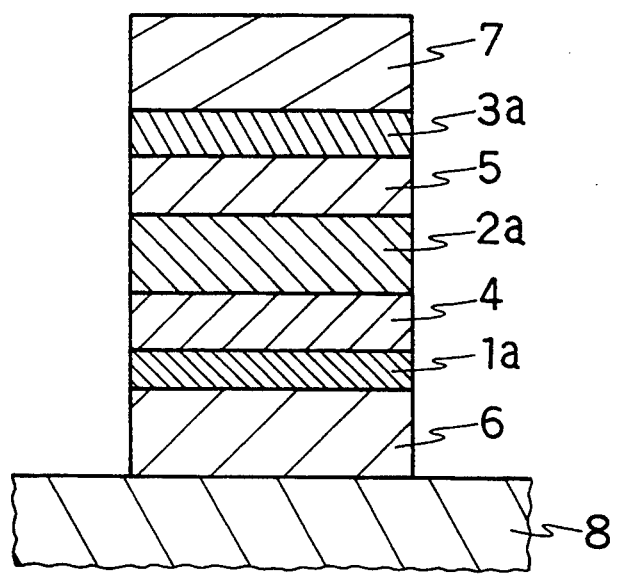
FIG. 15 is an explanatory section showing a MR element provided with a buffer layer and a cap layer as yet another embodiment of a MR element according to the present invention.

Although MR elements of a basically three-layered structure were used in previous Examples, a MR element of a basically five-layered structure is exemplified in this Example. FIG. 15 is an explanatory section of this MR element. Material and thickness of individual layer were as follows.

| Buffer layer | Fe | 4.0 nm |
| First magnetic layer | Co | 1.0 nm |

-continued

| Nonmagnetic layer | Cu | 2.5 nm |
|---|---|---|
| Second magnetic layer | Ni$_{80}$Fe$_{15}$Co$_5$ | 5.0 nm |
| Nonmagnetic layer | Cu | 2.5 nm |
| Third magnetic layer | Co | 1.0 nm |
| Cap layer | Fe | 4.0 nm |

A strong exchange coupling force was exerted between the buffer layer 6 and the first magnetic layer 1a and between the third magnetic layer 3a and the cap layer 7. Each pair of two layers exhibited behavior of magnetization direction as if it were of a single layer. Hence, this MR element can be considered to have a basically five-layered structure.

In the MR element of this Example, the buffer layer 6 and the cap layer 7 each formed of Fe were, respectively, made to have easy magnetization axes oriented in the same direction in the planes thereof, while the second magnetic layer 2a was made to have easy magnetization axis oriented perpendicular to those of the Fe layers in the plane thereof. The respective magnetization directions of the buffer layer 6 and first magnetic layer 1a moved together, and the reversal field of magnetization oriented along the easy magnetization axis of these layers was about 30 Oe. The pair of the third magnetic layer 3a and the cap layer 7 also had the reversal field of magnetization of about 30 Oe. On the other hand, the second magnetic layer 2a was magnetized independently of the other magnetic layers because the exchange coupling force from other magnetic layers hardly worked due to thick Cu nonmagnetic layers. Since the characteristics of individual layers were as such, only the magnetization direction of the second magnetic layer 2 being magnetically soft was moved at a low magnetic field within the range less than 30 Oe.

Figure 16:
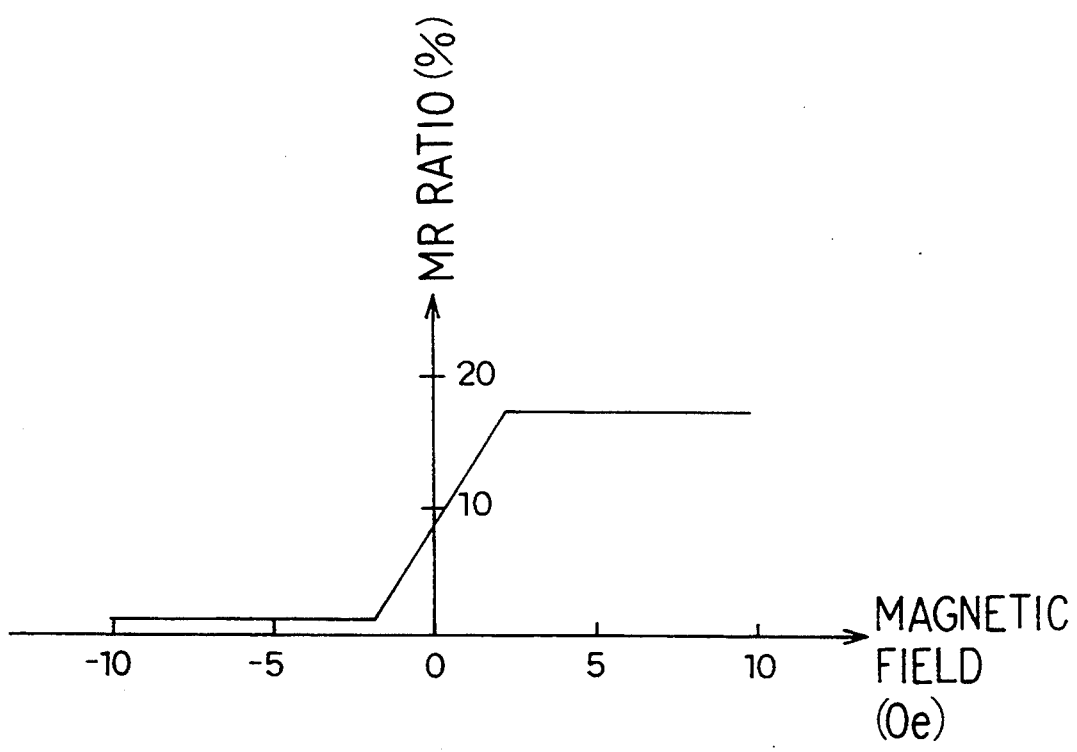
FIG. 16 is a diagrammatic representation showing a MR curve (minor loop) of a MR element of Example 36.

FIG. 16 shows the MR curve of this Example within the range of ±10 Oe. A magnetic field was applied along the easy magnetization axis of the Fe layer. When a magnetic field is set at 0, the magnetization direction of the second magnetic layer 2a was perpendicular to that of the Fe layer. When a magnetic field was applied, the magnetization direction of the second magnetic layer 2a was rotated in the plane thereof to vary in relative angle with the magnetization direction of the Fe layer whereby the resistance changes. A linear change in resistance was observed at a magnetic field within the range of ±4Oe of which the center was 0. A MR ratio per unit magnetic field was high, or as large as 4%/Oe.

As in Example 35, the MR element of this Example was connected with means for producing current at its opposite ends and means for sensing a change in electrical resistivity to constitute a MR sensor. When the intensity of the magnetic field applied was swept up and down 1000 times or more within the range of ±2 Oe, the MR curve shown in FIG. 16 was repeated exactly, and thus, this MR element was found to have satisfactory characteristics for an MR sensor.

EXAMPLE 37

In Example 36, the MR element had the first and third magnetic layers 1a and 3a each formed of a hard layer and the second magnetic layer 2a formed of a soft layer. That is, the MR element of Example 36 exhibited a change in resistance based on a change in the magnetization direction of the second magnetic layer 2a. However, the first and third magnetic layers 1a and 3a may be each formed of a soft layer with the second magnetic layer 2a formed of a hard layer. In this case a change in the magnetization directions of the first and third magnetic layers 1a and 3a produces a change in resistance. The following is one example of such an MR element.

| Buffer layer | Fe | 4.0 nm |
|---|---|---|
| First magnetic layer | Fe$_{83.5}$Hf$_{5.9}$Co$_{10.6}$ | 4.0 nm |
| Nonmagnetic layer | Cu | 2.5 nm |
| Second magnetic layer | Co | 3.0 nm |
| Nonmagnetic layer | Cu | 2.5 nm |
| Third magnetic layer | Fe$_{83.5}$Hf$_{5.9}$Co$_{10.6}$ | 4.0 nm |
| Cap layer | Fe | 4.0 nm |

In the MR element of this Example, the buffer layer 6 and the cap layer 7 each formed of Fe were, respectively, made to have easy magnetization axes oriented in the same direction in the planes thereof, while the second magnetic layer 2a was made to have easy magnetization axis oriented perpendicular to those of the Fe layers in the plane thereof. The magnetization direction of the pair of the buffer layer 6 and first magnetic layer 1a and that of the pair of the third magnetic layer 3a and cap layer 7 moved together. On the other hand, the second magnetic layer 2a was magnetized independently of the other magnetic layers, and the reversal field of magnetization oriented along the easy magnetization axis of the second magnetic layer 2a was about 80 Oe. This is because the exchange coupling force from other magnetic layers 1a and 3a hardly worked on the second magnetic layer 2a due to thick Cu nonmagnetic layers 4 and 5. Since the characteristics of individual layers were as such, only the magnetization direction of the second magnetic layer 2 being magnetically soft was moved at a low magnetic field within the range less than 80 Oe.

When a magnetic field within the range of ±10 Oe was applied along the easy magnetization axis of the second magnetic layer, an MR curve with the same figure in FIG. 16 is shown. When the magnetic field is set at 0, the magnetization directions of the first and third magnetic layers 1a and 3a were oriented perpendicular to that of the second magnetic layer 2a. When the magnetic field was applied, the magnetization directions of the first and third magnetic layers were rotated in the respective planes thereof to produce a change in relative angle formed between the magnetization direction of the pair of the first and third magnetic layers 1a and 3a and that of the second magnetic layer 2a whereby the resistance changes. A linear change in resistance was observed under application of a magnetic field within the range of ±2 Oe of which center was 0. A MR ratio per unit magnetic field was high, or as large as 2%/Oe.

EXAMPLE 38

Figure 17:
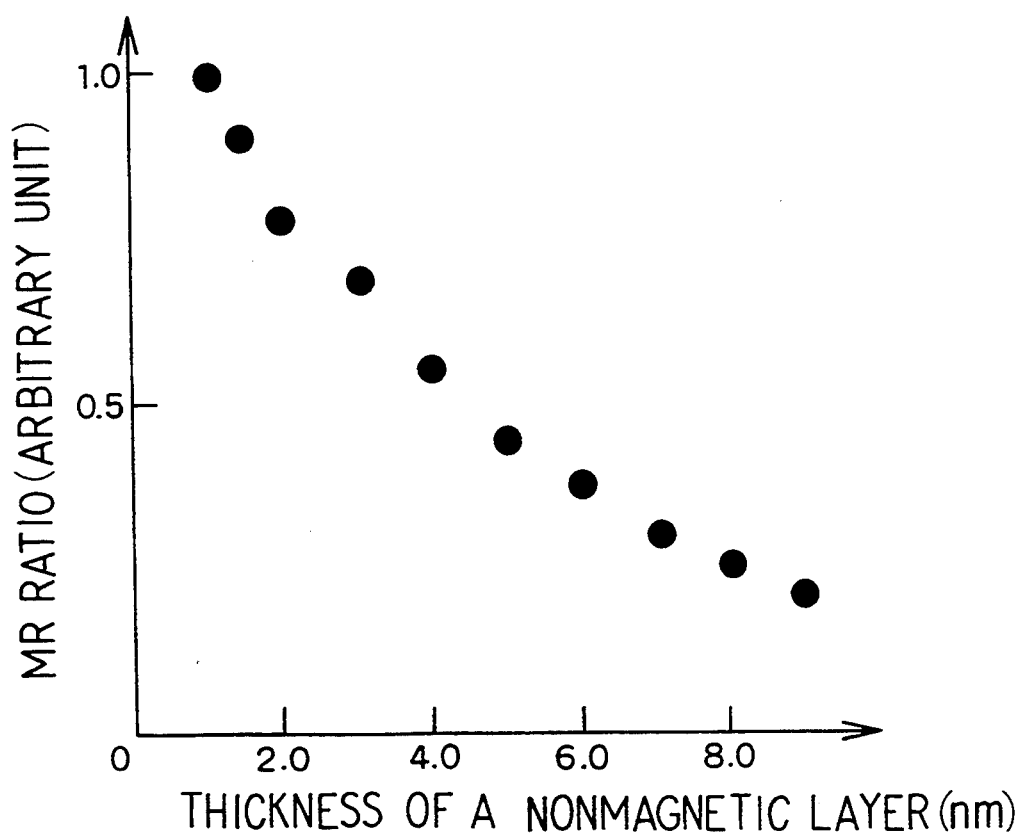
FIG. 17 is a graphic representation showing the relation between the thickness of the nonmagnetic layer and the MR effect in the MR element of Example 9.

A MR element of the structure shown in Example 9 was examined for its MR effect with the thickness of the nonmagnetic layer 4 differently varied. In FIG. 17 the horizontal represents the thickness of the nonmagnetic layer, and the vertical axis represents a relative value (in an arbitrary unit) of a MR ratio, which value is 1 when the thickness of the nonmagnetic layer is 1.0 nm. As apparent from the result shown in FIG. 17, the MR ratio decreases rapidly with increasing thickness of the nonmagnetic layer 4. The upper limit of the thickness of the nonmagnetic layer 4 is about 4 nm since if it is thicker than that limit, a shunt effect of current toward the nonmagnetic layer 4 increases undesirably. On the other hand, if the nonmagnetic layer 4 is too thin, the exchange coupling force exerted between the magnetic layers 1 and 2 increases too much thereby reducing the MR ratio. The lower limit of the thickness of the nonmagnetic layer is, therefore, about 1 nm. Consequently, the thickness of the nonmagnetic layer 4 is preferably about 1 to about 4 nm.

EXAMPLE 39

Figure 18:
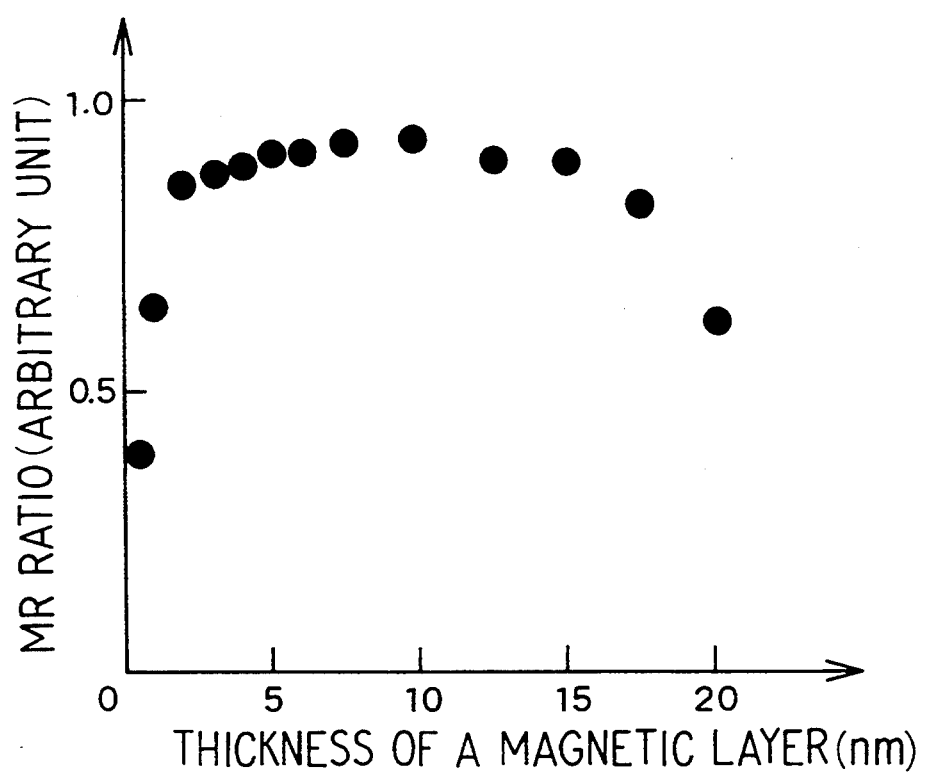
FIG. 18 is a graphic representation showing the relation between the thickness of the magnetic layer and the MR effect in the MR element of Example 9.

A MR element of the structure shown in Example 9 was examined for its MR effect relative to the thickness of the second magnetic layer 2. The result of the examination was as shown in FIG. 18, wherein the horizontal axis represents the thickness of the second magnetic layer 2, and the vertical axis represents a relative value (in an arbitrary unit) of the MR ratio, which value assumes 1 when the thickness of the second magnetic layer 2 is 10 nm. As apparent from FIG. 18, the MR effect depends also on the thickness of the second magnetic layer 2. Although dependent on the presence or absence of the buffer layer 6 or cap layer 7 and the thickness thereof, a preferable thickness of the second magnetic layer 2, as well as of the first magnetic layer 1, is about 15 nm or less. If the second magnetic layer 2 is thicker than about 15 nm, the shunt effect of current becomes undesirably severe.

As has been described, the MR element of the present invention is of a basically three-layered structure in which the first and second magnetic layers sandwich a nonmagnetic layer or of a basically five-layered structure in which nonmagnetic layers are sandwiched between the first and second magnetic layers and between the second and third magnetic layers, respectively. The MR element of such arrangement offers a surprisingly large MR ratio under application of a sufficiently low magnetic field despite such a simple arrangement thereof.

Further, the provision of an additional layer (a buffer layer, a cap layer or an intermediate supplementary layer) adjacent to a magnetic layer makes it possible to enhance and control the characteristics of the MR element.

The magnetic thin film memory of the present invention is a novel magnetic recording device utilizing a GMR effect which cannot be realized without the MR element of the present invention.

The MR sensor of the present invention is an improved magnetic field sensing device which offers a good linearity in rate of a change in resistance and a very good sensitivity to a magnetic field to be sensed and which is capable of sensing a very small change in magnetic field with accuracy.

What is claimed is:

1. A magnetoresistive element comprising a substrate and a three-layered structure provided on the substrate,
   wherein said three-layered structure comprises a first magnetic layer, a second magnetic layer, and a nonmagnetic layer provided between said first and second magnetic layers;
   the magnetization directions of said first and second magnetic layers are oriented parallel or antiparallel to each other under a magnetic field applied thereto set at 0.

2. The magnetoresistive element of claim 1, wherein said nonmagnetic layer has a thickness ranging from 1 to 4 nm.

3. The magnetoresistive element of claim 1, wherein said nonmagnetic layer is formed of Cu, Ag, Au, Rh, Ru, Cr or Ir.

4. The magnetoresistive element of claim 1, wherein said first magnetic layer and said second magnetic layer are each formed of Ni, Fe, Co, a Ni—Fe alloy, a Ni—Co alloy, a Fe—Co alloy, a Ni—Fe—Co alloy, a Fe—Pt alloy, a Co—Pt alloy, a Fe—Hf—C alloy, or a Co—Zr—Nb alloy.

5. A magnetoresistive element of claim 1, further comprising at least one of a buffer layer and a cap layer,
   wherein said buffer layer is provided between said substrate and said first magnetic layer;
   said cap layer is provided on said second magnetic layer.

6. The magnetoresistive element of claim 5, wherein at least one of said buffer layer and said cap layer is formed of a magnetic material and controls a magnetization of the magnetic layer adjacent thereto such that said first and second magnetic layers have a difference in the reversal field of magnetization.

7. The magnetoresistive element of claim 5, wherein said buffer layer is formed of Fe, Ni, Co, a Ni—Fe alloy, a Ni—Co alloy, a Fe—Co alloy, a Ni—Fe—Co alloy, NiO, FeO, CoO, a Fe—Mn alloy, a Fe—Cr alloy, a Fe—Pt alloy, a Co—Pt alloy, a Fe—Hf—C alloy, or a Co—Zr—Nb alloy, Cu, Ag, Au, Cr, Ti, Nb, Ta, Zr, or Hf.

8. The magnetoresistive element of claim 5, wherein said cap layer is formed of Fe, Ni, Co, Mn, a Ni—Fe alloy, a Ni—Co alloy, Fe—Co alloy, a Ni—Fe—Co alloy, NiO, FeO, CoO, a Fe—Mn alloy, a Fe—Pt alloy, a Co—Pt alloy, Fe—Hf—C alloy, or a Co—Zr—Nb alloy.

9. A magnetoresistive element comprising a substrate, and a three-layered structure having a first magnetic layer, a second magnetic layer and a nonmagnetic layer provided between the first and second magnetic layers, the first and second magnetic layers being each formed of $Fe_{1-x}Co_x(0.5 \leq x \leq 1.0)$, said three-layered structure further having at least one of a buffer layer provided between the substrate and the first magnetic layer and a cap layer provided on the second magnetic layer.

10. The magnetoresistive element of claim 9, wherein at least one of said buffer layer and said cap layer is formed of a magnetic material and controls a magnetization of said first or second magnetic layer which is adjacent to said buffer layer or said cap layer such that said first and second magnetic layers have a difference in the reversal field of magnetization.

11. The magnetoresistive element of claim 9, wherein said nonmagnetic layer is formed of Cu and has a thickness ranging from 1 to 4 nm.

12. The magnetoresistive element of claim 9, wherein said buffer layer is formed of Fe, Ni, Co, a Ni—Fe alloy, a Ni—Co alloy, Fe—Co alloy, a Ni—Fe—Co alloy, NiO, FeO, CoO, a Fe—Mn alloy, a Fe—Cr alloy, a Fe—Pt alloy, a Co—Pt alloy a Fe—Hf—C alloy, a Co—Zr—Nb alloy, Cu, Ag, Au, Cr, Ti, Nb, Ta, Zr, or Hf.

13. The magnetoresistive element of claim 9, wherein said cap layer is formed of Fe, Ni, Co, Mn, a Ni—Fe alloy, a Ni—Co alloy, a Fe—Co alloy, a Ni—Fe—Co alloy, NiO, FeO, CoO, a Fe—Mn alloy, a Fe—Pt alloy, a Co—Pt alloy, a Fe—Hf—C alloy, or a Co—Zr—Nb alloy.

14. A magnetoresistive element comprising a substrate, and a five-layered structure provided on the substrate and having a first magnetic layer, a second magnetic layer, a third magnetic layer, which layers are stacked on the substrate in that order, a first nonmagnetic layer sandwiched between the first and second magnetic layers and a second nonmagnetic layer sandwiched between the second and third magnetic layers, each of said first and second magnetic layers being formed of $Fe_{1-x}Co_x(0.5 \leq x \leq 1.0)$, wherein under a magnetic field applied thereto set at 0, the magnetization direction of the first magnetic layer and that of the third magnetic layer are oriented parallel to each other while the magnetization direction of the second magnetic layer is oriented perpendicular to the magnetization directions of the first and third magnetic layers.

15. The magnetoresistive element of claim 14, which varies in electrical resistance on the basis of a change in the magnetization direction of said second magnetic layer.

16. The magnetoresistive element of claim 14, which varies in electrical resistance on the basis of a change in the magnetization directions of said first and third magnetic layers.

17. The magnetoresistive element of claim 14, wherein said nonmagnetic layers each has a thickness ranging from 1 to 4 nm.

18. The magnetoresistive element of claim 14, wherein said nonmagnetic layers are each formed of Cu, Ag, Au, Rh, Ru, Cr, or Ir.

19. The magnetoresistive element of claim 14, further comprising at least one of a buffer layer provided between said substrate and said first magnetic layer and a cap layer provided on said third magnetic layer.

20. The magnetoresistive element of claim 19, wherein said buffer layer or said cap layer controls a magnetization of the magnetic layer adjacent thereto such that said first or third magnetic layer and said second magnetic layer have a difference in the reversal field of magnetization.

21. The magnetoresistive element of claim 19, wherein said buffer layer is formed of Fe, Ni, Co, a Ni—Fe alloy, a Ni—Co alloy, Fe—Co alloy, a Ni—Fe—Co alloy, Nio, FeO, CoO, a Fe—Mn alloy, a Fe—Cr alloy, a Fe—Pt alloy, a Co—Pt alloy, a Fe—Hf—C alloy, a Co—Zr—Nb alloy, Cu, Ag, Au, Cr, Ti, Nb, Ta, Zr, or Hf.

22. The magnetoresistive element of claim 19, wherein said cap layer is formed of Fe, Ni, Co, mn, a Ni—Fe alloy, a Ni—Co alloy, a Fe—Co alloy, a Ni—Fe—Co alloy, Nio, FeO, CoO, a Fe—Mn alloy, a Fe—Pt alloy, a Co—Pt alloy, a Fe—Hf—C alloy, or a Co—Zr—Nb alloy.

23. A magnetoresistive element comprising a substrate, a five-layered structure having a first magnetic layer, a second magnetic layer, a third magnetic layer, which layers are stacked on the substrate in that order, a first nonmagnetic layer sandwiched between the first and second magnetic layers and a second nonmagnetic layer sandwiched between the second and third magnetic layers, and at least one of a buffer layer provided between the substrate and the first magnetic layer and a cap layer provided on the third magnetic layer, each of said first and second magnetic layers being formed of $Fe_{1-x}Co_x$ $(0.5 \leq x \leq 1.0)$.

24. The magnetoresistive element of claim 23, wherein said buffer layer or said cap layer controls a magnetization of the magnetic layer adjacent thereto such that said first or third magnetic layer and said second magnetic layer have a difference in the reversal field of magnetization.

25. The magnetoresistive element of claim 23, wherein said buffer layer is formed of Fe, Ni, Co, a Ni—Fe alloy, a Ni—Co alloy, a Fe—Co alloy, a Ni—Fe—Co alloy, NiO, FeO, CoO, a Fe—Mn alloy, a Fe—Cr alloy, a Fe—Pt alloy, a Co—Pt alloy, a Fe—Hf—C alloy, a Co—Zr—Nb alloy, Cu, Ag, Au, C, Ti, Nb, Ta, Zr, or Hf.

26. The magnetoresistive element of claim 23, wherein said cap layer is formed of Fe, Ni, Co, Mn, a Ni—Fe alloy, a Ni—Co alloy, a Fe—Co alloy, a Ni—Fe—Co alloy, NiO, FeO, CoO, a Fe—Mn alloy, a Fe—Pt alloy, a Co—pt alloy, a Fe—Hf—C alloy, or a Co—Zr—Nb alloy.

27. The magnetoresistive element of claim 23, wherein said nonmagnetic layers each has a thickness ranging from 1 to 4 nm.

28. The magnetoresistive element of claim 23, wherein said nonmagnetic layers are each formed of Cu, Ag, Au, Rh, Ru, Cr, or Ir.

29. A magnetic thin film memory comprising the magnetoresistive element of claim 1, means for producing electric current to flow through the magnetoresistive element, and means for sensing a change in electrical resistance of the magnetoresistive element.

30. A magnetoresistance sensor comprising the magnetoresistive element of claim 9, means for producing electric current to flow through the magnetoresistive element, and means for sensing a change in electrical resistance of the magnetoresistive element as a function of a magnetic field to be sensed.

31. The magnetoresistance sensor of claim 30, wherein said first magnetic layer and said second magnetic layer have magnetization directions oriented perpendicular to each other under a magnetic field applied thereto set at 0.

32. A magnetoresistave sensor comprising the magnetoresistive element of claim 14, means for producing electric current to flow through the magnetoresistive element, and means for sensing a change in electrical resistance of the magnetoresistive element as a function of a magnetic field to be sensed.

33. The magnetoresistive element according to claim 14, wherein said third magnetic layer is formed of $Fe_{1-x}Co_x$ $(0.5 \leq x \leq 1.0)$.

34. The magnetoresistive element according to claim 24, wherein said third magnetic layer is formed of $Fe_{1-x}(0.5 \leq x \leq 1.0)$.

* * * * *